United States Patent [19]

Shinohara et al.

[11] Patent Number: 5,060,042
[45] Date of Patent: Oct. 22, 1991

[54] PHOTOELECTRIC CONVERSION APPARATUS WITH RERESH VOLTAGE

[75] Inventors: Mahito Shinohara, Tokyo; Shigetoshi Sugawa, Atsugi; Seiji Hashimoto, Yokohama; Mamoru Miyawaki, Tokyo, all of Japan

[73] Assignee: Canon Kabushiki Kaisha, Tokyo, Japan

[21] Appl. No.: 548,508

[22] Filed: Jul. 5, 1990

Related U.S. Application Data

[63] Continuation of Ser. No. 470,407, Jan. 29, 1990, Pat. No. 4,962,412, which is a continuation of Ser. No. 149,082, Jan. 27, 1988, abandoned.

[30] Foreign Application Priority Data

| Jan. 29, 1987 [JP] | Japan | 62-17150 |
| May 11, 1987 [JP] | Japan | 62-112290 |
| May 22, 1987 [JP] | Japan | 62-123872 |
| May 26, 1987 [JP] | Japan | 62-126888 |

[51] Int. Cl.⁵ ............................................ H04L 27/14
[52] U.S. Cl. ................................. 357/30; 357/32; 357/58; 357/24
[58] Field of Search ............ 357/30 G, 30 H, 30 P, 357/30 S, 31, 32, 24 LR, 58

[56] References Cited

U.S. PATENT DOCUMENTS

| 4,117,514 | 9/1978 | Terui et al. | 357/30 G X |
| 4,407,010 | 9/1983 | Baji et al. | 357/30 H X |
| 4,586,084 | 4/1986 | Imai | 357/24 X |
| 4,712,138 | 12/1987 | Kyuma et al. | 358/213.31 |
| 4,743,955 | 5/1988 | Matsumoto | 357/30 H X |

FOREIGN PATENT DOCUMENTS

| 0206649 | 12/1986 | European Pat. Off. | 357/30 P |
| 3529025 | 2/1986 | Fed. Rep. of Germany . | |
| 2144265 | 2/1985 | United Kingdom | 357/30 H |

OTHER PUBLICATIONS

Nishizawa et al, "Static Induction Image Sensors," *IEEE Transactions on Electron Devices*, vol. Ed-26, No. 12, Dec. 1979, pp. 1970–1978.

*Primary Examiner*—William Mintel
*Attorney, Agent, or Firm*—Fitzpatrick, Cella Harper & Scinto

[57] ABSTRACT

A photoelectric conversion apparatus having an array of plural photoelectric conversion cells having semiconductor areas for accumulating photo-induced carriers, in which a gate-insulated transistor is formed with main electrodes composed of the semiconductor areas of neighboring photoelectric conversion cells, for separating the cells and for collective refreshing of the cells.

5 Claims, 19 Drawing Sheets

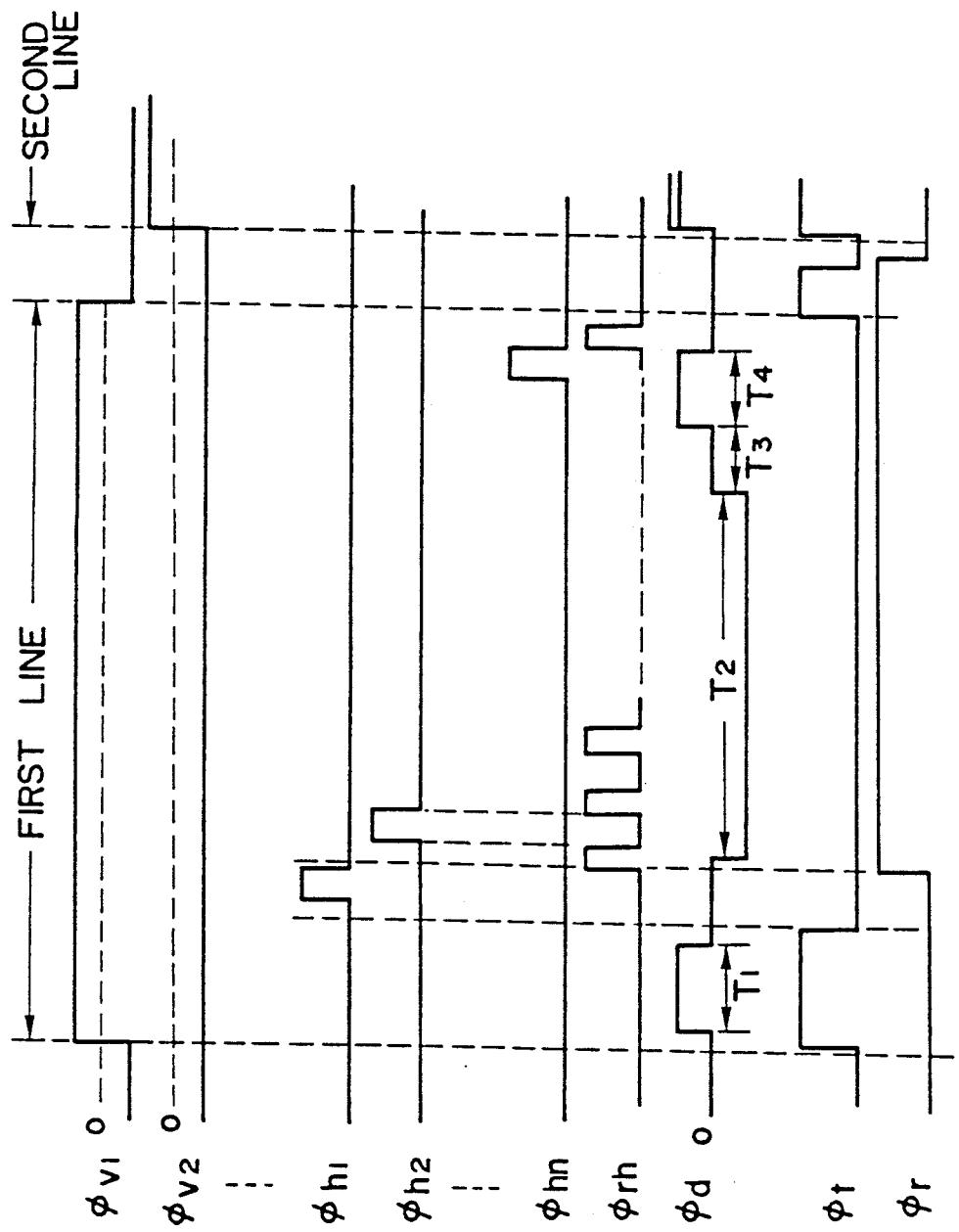

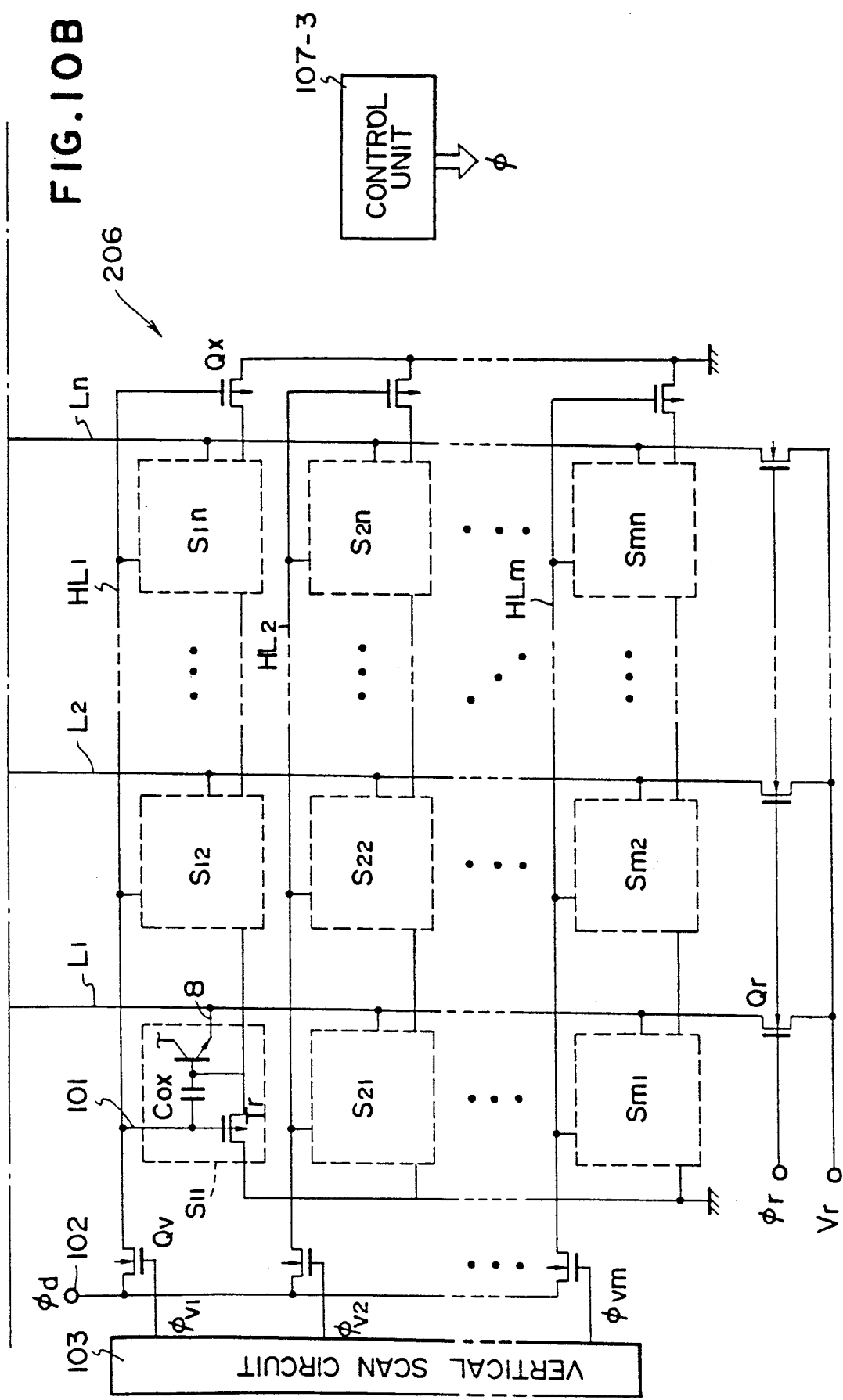

PHOTOELECTRIC CONVERSION APPARATUS WITH RERESH VOLTAGE

This application is a continuation of application Ser. No. 07/470,407 filed Jan. 29, 1990, now U.S. Pat. No. 4,962,412 which is a continuation of application Ser. No. 07/149,082 filed Jan. 27, 1988, now abandoned.

BACKGROUND OF THE INVENTION

1. Field of the Invention

The present invention relates to a photoelectric conversion apparatus of the type that accumulates carriers generated by photoexcitation.

2. Related Background Art

FIG. 6A is a schematic cross-sectional view of a photoelectric conversion apparatus disclosed in the Japanese Laid-open Patent Gazettes Nos. 12759-12765/1985, and FIG. 6B is an equivalent circuit diagram of a photoelectric conversion cell thereof.

As shown in these drawings, photoelectric conversion cells are arranged on an n-type silicon substrate 1, and each cell is electrically insulated from neighboring cells by separating areas 2 consisting of $SiO_2$, $Si_3N_4$ or polysilicon.

Each photoelectric conversion cell is constructed in the following manner.

On an $n^-$-area 3 of a low impurity concentration formed for example by epitaxial technology, a p-area 4 is formed by doping of p-type impurity, and in said p-area 4 there is formed an $n^+$-area 5 is formed by impurity diffusion or ion implantation. The p-area 4 and $n^+$-area 5 constitute the base and emitter of a bipolar transistor.

An oxide film 6 is formed on the $n^-$-area 3 having the above-mentioned areas, and a capacitor electrode 7 of a predetermined area is formed on said oxide film 6. The capacitor electrode 7 is positioned opposite to the p-type base area 4 across the oxide film 6, and is given a pulse voltage to control the potential of the floating p-base area 4.

An emitter electrode 8 is connected to the $n^+$-emitter area 5. There are also formed, on the bottom face of the substrate 1, an $n^+$-area 11 with a high impurity concentration, and a collector electrode 12 for giving a potential to the collector of the bipolar transistor.

The basic function of the above-explained apparatus is as follows. In an initial state the p-type base area 4 of the bipolar transistor assumes a negative potential. Light 13 is introduced to said p-type base area 4 to generate electron-hole pairs, of which positive holes are accumulated in said p-type base area 4 to elevate the potential thereof in the positive direction (accumulating operation).

Then a positive voltage pulse for signal reading is given to the capacitor electrode 7, and a read-out signal corresponding to the change in the base potential in the accumulating operation is released from the floating emitter electrode 8 (signal reading operation). This reading operation can be repeated, since the amount of accumulated charge in the p-type base area 4 scarcely changes.

For eliminating the positive holes accumulated in the p-type base area 4, the emitter electrode 8 is grounded and a positive refreshing pulse is supplied to the capacitor electrode 7. Said pulse biases the p-type base area 4 in the forward direction with respect to the $n^+$-type emitter area 5, thereby allowing elimination of the accumulated positive holes. The p-type base area 4 returns to the initial state at the end of said refreshing pulse (refreshing operation). The operations of accumulation, reading and refreshing can thereafter be repeated in the same manner.

In summary, the above-explained process accumulates the photogenerated carriers in the p-type base area 4 and controls the current between the emitter electrode 8 and the collector electrode 12 by the amount of accumulated charge. Thus the amount of accumulated carriers is read after amplification by the amplifying function of each cell, so that the device can provide a high output, a high sensitivity and a low noise level.

In this process the potential Vp generated in the base by the photoinduced carriers (positive holes in this case) accumulated therein is given by Q/C, wherein Q is the amount of charge of the positive holes accumulated in the base area and C is the capacitance connected to the base area. As will be apparent from this relation, at a higher degree of integration, the Q and C decrease together with the reduction in cell size, so that the potential Vp generated by photoexcitation is maintained almost constant. Consequently this proposed process is advantageous also for the future development toward a higher degree of resolution.

However, in the conventional photoelectric conversion apparatus explained above, in which the refreshing operation for dissipating the carriers accumulated in the base area relies on the forward current between the emitter and the base, the base potential after the refreshing operation is inevitably related to that before the refreshing if the refreshing pulse is short, thus giving rise to drawbacks of a retentive image and a non-linearity in the photoelectric conversion characteristic.

FIG. 6C is a schematic plan view of another photoelectric conversion apparatus described in the above-mentioned patent references, and FIGS. 6D and 6E are respectively a cross-sectional view along a line A—A' and an equivalent circuit diagram.

As shown in these drawings, photoelectric conversion cells are arranged on an n-type silicon substrate 601, and each cell is electrically insulated from neighboring cells by separating areas 602 consisting of $SiO_2$, $Si_3N_4$ or polysilicon.

Each cell is constructed in the following manner.

On an $n^-$-type area 603 of a low impurity concentration formed for example by an epitaxial process, a p-type base area 604 and a p-type area 605 are formed by doping a p-type impurity such as boron, and an $n^+$-type emitter area 606 is formed in the p-type base area 604.

Said p-type base area 604 and the p-type area 605 constitute source and drain areas of a p-channel MOS transistor to be explained later.

An oxide film 607 is formed on the $n^-$-type area 603 containing the above-mentioned areas, and a gate electrode 608 for said MOS transistor and a capacitor electrode 609 are formed on said oxide film 607. The capacitor electrode 609 is positioned opposite to the p-type base area 604 across the oxide film 607, thus constituting a capacitor for controlling the base potential.

There are also provided an emitter electrode 610 connected to the $n^+$-type emitter area 606 and an electrode 611 connected to the p-type area 605, and, on the bottom face of the substrate 601, a collector electrode 612 across an ohmic contact layer.

In the following there will be explained the function of the above-explained photoelectric conversion cell.

Light is introduced into the p-type base area 604 to accumulate the carriers (positive holes in this case) corresponding to the amount of incident light in the p-type base area 604 (accumulating operation).

The accumulated carriers causes a change in the base potential, which is read from the emitter electrode 610. Thus an electric signal can be obtained corresponding to the amount of incident light (reading operation).

In the following there will be explained a refreshing operation for dissipating the positive holes accumulated in the p-type base area 604.

FIGS. 6F and 6G are wave form charts showing the refreshing operation.

As shown in FIG. 6F, the MOS transistor is turned on when a negative voltage exceeding a threshold value is applied to the gate electrode 608.

For refreshing, as shown in FIG. 6G, the emitter electrode 610 is grounded, and the electrode 611 is also brought to the ground potential. Then a negative voltage is applied to the gate electrode 608 to turn on the p-channel MOS transistor, whereby the p-type base area 604 is brought to a constant potential regardless of the accumulated potential. Then a refreshing positive pulse is applied to the capacitor electrode 609 to bias the p-type base area 604 in the forward direction with respect to the $n^+$-type emitter area 606, whereby the accumulated positive holes are eliminated through the grounded emitter electrode 610. The p-type base area 604 returns to the initial state of negative potential at the end of the refreshing pulse (refreshing operation).

In this manner the remaining charge is dissipated by the refreshing pulse after the potential of the p-type base area 604 is brought to a constant value by the MOS transistor, so that the new accumulating operation can be conducted independently from the preceding accumulating operation. Also a high speed operation is possible since the retentive charge can be rapidly dissipated.

It is also possible to complete the refreshing operation by turning on the MOS transistor, through the application of a voltage for complete refreshing to the electrode 611.

The operations of accumulation, reading and refreshing can thereafter be repeated in the same manner.

However such conventional photoelectric conversion apparatus is still associated with a drawback of a low aperture ratio, due to the presence of the refreshing MOS transistor on the light-receiving surface, and the presence of wirings required for supplying a constant voltage to the electrode 611 and for supplying pulses to the gate of the refreshing MOS transistor, particularly in case of forming an area sensor. Also the structure is complicated by the increased number of driving pulses.

Also in such conventional apparatus, the readout signal contains unnecessary signals such as driving noises and dark signals.

The driving noises are generated in the read-out of the signal by driving the photosensor, and include noises resulting from fluctuations in the manufacture, for example in the shape of each element, and smears resulting from the separation of elements and depending on the amount of incident light.

The dark signals are caused by dark current in the photosensor, and fluctuate mainly depending on the accumulating time of the photosensor and the circumferential temperature.

Such driving noises and dark signals become a problem particularly in image taking under a low luminosity, since, in such condition, the obtained signal level is inevitably low, so that such unnecessary signals reduce the S/N ratio and deteriorate the image quality. Such unnecessary signals have to be reduced in order to improve the image quality.

However, as explained above, the dark signals depend significantly on the temperature and the accumulating time, while the driving noises are much less dependent on such factors. Consequently the elimination of such unnecessary signals require the separation of these signals and determination of independent correction coefficients, for which a large memory capacity is required, further leading to a complex signal processing, an increased cost and a large space requirement for the device.

In order to avoid such drawbacks, the present applicant already proposed, in the Japanese Patent Application No. 229625/1986, a photoelectric conversion device capable of providing an output signal of a high S/N ratio with a simple structure, by subtracting, from the read-out signal of a photoelectric conversion element, the retentive signal after refreshing thereof, thereby eliminating the unnecessary components such as dark signals and driving noises.

However such structure is still unable to avoid the loss in the aperture ratio, caused by the presence of the separating areas and the refreshing transistors.

SUMMARY OF THE INVENTION

An object of the present invention is to provide a photoelectric conversion apparatus capable of achieving a refreshing operation and element separation with a simple structure.

Another object of the present invention is to provide a photoelectric conversion apparatus capable of a refreshing operation without the loss in the aperture ratio.

Still another object of the present invention is to provide a photoelectric conversion apparatus capable of providing an output signal with a high S/N ratio.

Still another object of the present invention is to provide a photoelectric conversion apparatus capable of reducing the driving system such as transistors, and reducing the size of the circuit thereof.

In an embodiment, the photoelectric conversion apparatus of the present invention is featured by an array of plural photoelectric conversion cells having semiconductor areas for accumulating carriers generated by photoexcitation, in which a gate-insulated transistor is formed with main electrodes composed of said semiconductor areas of neighboring cells.

Said insulated gate transistor, when turned on, serves to regulate the semiconductor area of each cell at a constant potential regardless of the amount of accumulated carriers, and, when turned off, serves to electrically separate the photoelectric conversion cells.

In another embodiment, the photoelectric conversion apparatus of the present invention is featured by an array of plural photoelectric conversion cells each having a semiconductor area for accumulating the carriers generated by photo-excitation and a capacitor for controlling the potential of said semiconductor area, in which an gate insulated transistor is formed with main electrodes composed of said semiconductor areas of neighboring cells, wherein the gate electrodes of said insulated gate transistors are connected in common by a desired number and said capacitors are connected in common to the wiring used for connecting said transistors.

Thus, said insulated gate transistors, when turned on by a voltage applied to said gate electrodes, serve to regulate the potential of the semiconductor areas of the cells of a desired number to a constant value regardless of the amounts of accumulated carriers therein, and, when turned off, can electrically separate said photoelectric conversion cells.

Consequently the aperture ratio can be made larger than in the conventional apparatus, since the dissipation of accumulated carriers does not require a particular wiring, and since the gate electrode is formed between the cells.

Also the common connection of the capacitors and the gate electrodes allow to achieve a high speed operation, satisfactory retentive image characteristic and photoelectric conversion characteristic.

In another embodiment, the photoelectric conversion apparatus of the present invention, having accumulation means for accumulating the signals from photoelectric conversion elements, is featured by first accumulation means for accumulating the readout signals obtained by a reading operation of said photoelectric conversion elements, second accumulation means for accumulating retentive signals after a refreshing operation of said photoelectric conversion elements, and difference calculating means for calculating the difference between the read-out signals and the retentive signals accumulated in said first and second accumulation means thereby eliminating the retentive signals from said read-out signal, wherein a larger forward bias is applied to said photoelectric conversion elements in said refreshing operation than in other operations.

The subtraction of the retentive signals after refreshing from the read-out signals allows removal, from the read-out signals, of unnecessary components such as dark signals and driving noises of the photoelectric conversion elements, and the larger forward bias applied to the photoelectric conversion elements in the refreshing operation enables complete elimination of the unnecessary signals and the retentive signals without extending the refreshing time.

The refreshing of the photoelectric conversion elements means dissipation of the optical information, such as charges accumulated in said elements, and includes complete refreshing for completely dissipating the optical information and transient refreshing for dissipating said information by means of the transient characteristic of the transistor.

In another embodiment, the photoelectric conversion device of the present invention is featured by an array of plural photoelectric conversion cells each having a semiconductor area for accumulating the carriers generated by photoexcitation and a capacitor for controlling the potential of said semiconductor area, in which a gate-insulated transistor is formed with main electrodes composed of said semiconductor areas of the neighboring photoelectric conversion cells, and there are further provided a first line for applying a control voltage to the gate of said gate-insulated transistor and a second line for applying a control voltage to said capacitor.

Thus, said insulated gate transistors when turned on by a voltage supplied to said first line, serve to regulate the semiconductor areas simultaneously to a constant potential regardless of the amounts of accumulated carriers therein, and, when turned off, can electrically separate said cells.

Also a control voltage supplied to the second line allows to control the potential of said semiconductor areas, thereby effecting for example a reading operation of the accumulated carriers. Since said second line can be given the control voltage independently from the first line, the voltage of the control line need not be varied by a large amount as in the conventional apparatus. It is therefore possible to reduce the load of the driving system and to decrease the circuit area.

The foregoing and still other objects of the present invention, and the advantages thereof, will become fully apparent from the following description to be taken in conjunction with the attached drawings.

BRIEF DESCRIPTION OF THE DRAWINGS

FIG. 5 is a partial timing chart showing an example of function of said embodiment;

FIG. 10B is a plan view of the FIG. 10A embodiment;

DETAILED DESCRIPTION OF THE PREFERRED EMBODIMENTS

Now the present invention will be clarified in detail by embodiments thereof shown in the attached drawings.

Figure 1:
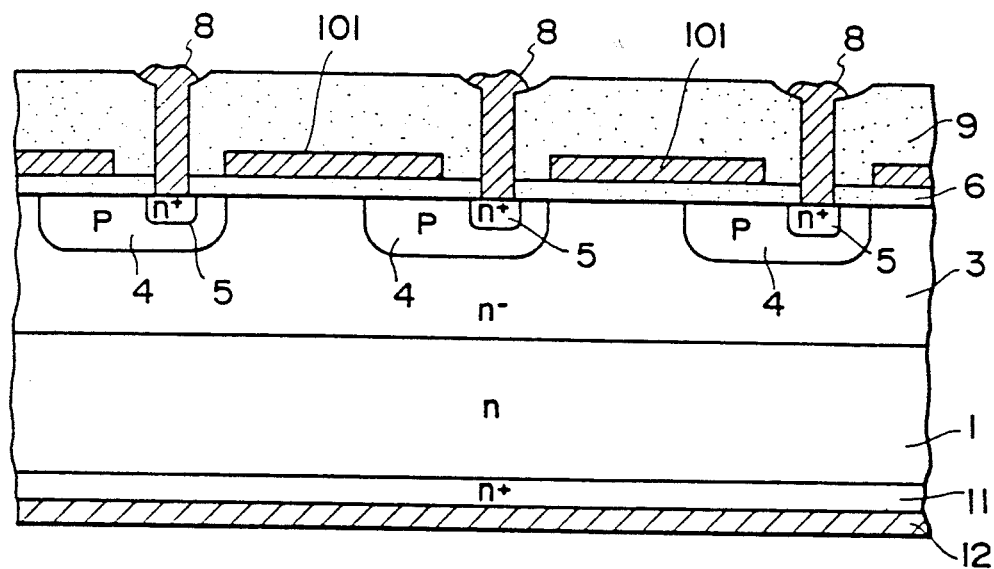
FIG. 1 is a schematic cross-sectional view of an embodiment of the photoelectric conversion apparatus of the present invention.

FIG. 1 is a schematic cross-sectional view of a photoelectric conversion apparatus embodying the present invention, wherein components corresponding to those in FIGS. 6A to 6G are represented by corresponding numbers.

As shown in FIG. 1, p-type base areas 4 of photoelectric conversion cells are formed at a predetermined pitch on an $n^-$-area 3 constituting a collector area. An $n^+$-type emitter area 5 is formed in each p-type base area 4.

An electrode 101 is formed, on an oxide film 6, bridging each p-type base area 4 and a neighboring p-type base area 4. A transparent insulating layer 9 is formed on oxide layer 6 and electrode 101 as shown. Said electrode 101 is opposed to the p-type base area 4, in a portion above said base area, to constitute a capacitor Cox for controlling the base potential, and, in a portion between the neighboring base areas, serves as a gate electrode for a MOS transistor Tr of which source and drain are composed by said neighboring p-type base areas. In the present embodiment, therefore, the capacitor electrode is connected to the gate electrode of said MOS transistor Tr.

Said MOS transistor is constructed in the present embodiment, as a normally-off p-channel transistor, so that it is turned off when the electrode 101 is at the ground potential or a positive potential. In this state the p-type base areas 4 of the neighboring cells are electrically separated. Conventional separating area is no longer necessary, and this fact is advantageous to make the device compact.

On the other hand, when the electrode 101 is given a negative potential exceeding a threshold value Vth, the MOS transistor Tr is turned on to mutually connect the p-type base areas 4 of the cells.

Figure 2:
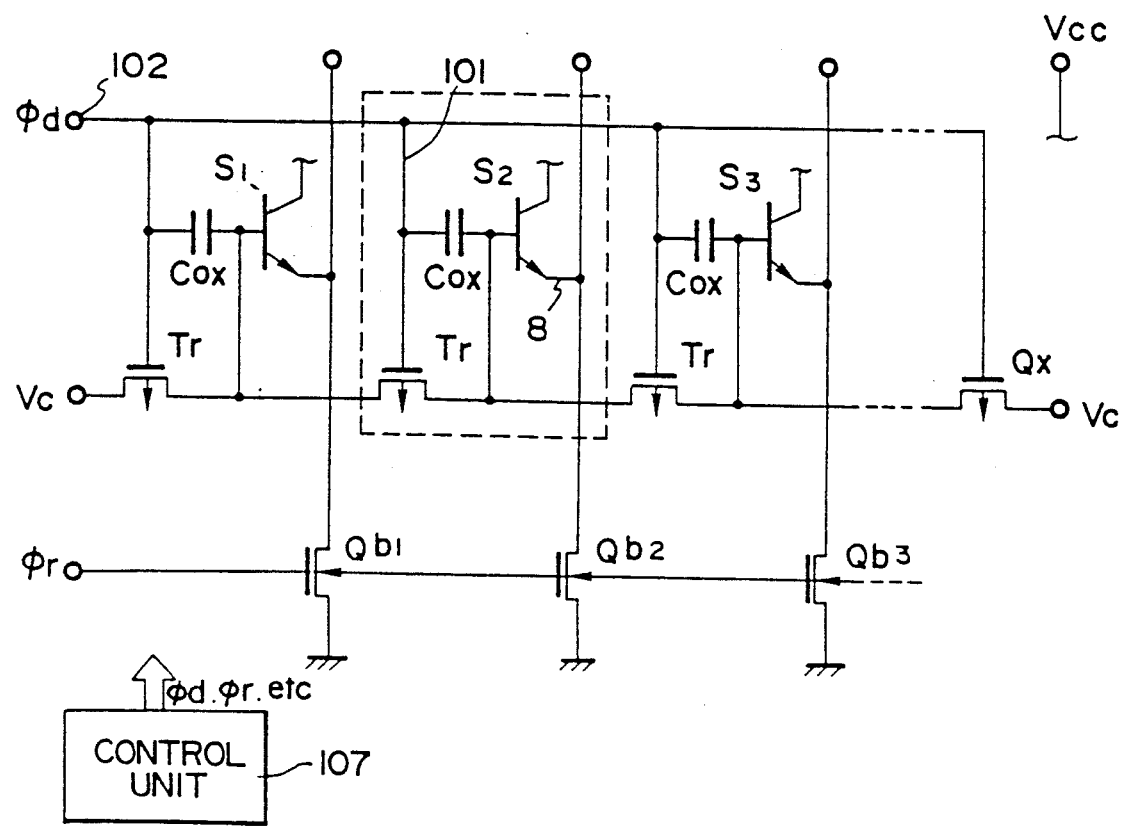
FIG. 2 is a partial equivalent circuit diagram of said embodiment.

FIG. 2 is a partial equivalent circuit diagram of the present embodiment, wherein a broken-lined area corresponds to a photoelectric conversion cell.

As shown in FIG. 2, said cells S1-Sn are arranged in a linear array and mutually connected.

The electrodes 101 of said cells are commonly connected to a terminal 102 for receiving a pulse $\phi d$.

The MOS transistors Tr of the cells are serially connected. Unrepresented p-type areas are formed at predetermined distance from the p-type base areas 4 of the end cells S1 and Sn, and a normally-off p-channel MOS transistor Qx is formed next to the cell Sn.

The gate electrode of said MOS transistor Qx receives the same pulse $\phi d$ as that supplied to the electrodes 101, whereby said unrepresented p-type area is maintained at a constant potential Vc. Also the unrepresented p-type area next to the MOS transistor Tr of the cell S1 is also maintained at the constant potential Vc.

Consequently, when all the MOS transistors Tr and Qx are turned on, the p-type base areas 4 of the cells are regulated to the constant potential Vc. On the other hand, said cells are mutually separated electrically, when said transistors are turned off.

The emitter electrodes 8 of the cells are grounded respectively through resetting transistors Qb1-Qbn, of which gate electrodes receive a common pulse $\phi r$.

The collector electrodes 12 receive a positive voltage Vcc. A control unit 107 releases the pulses $\phi d$, $\phi r$, and scanning pulses for successively scanning the emitter outputs of the cells S1-Sn.

Figure 3A:
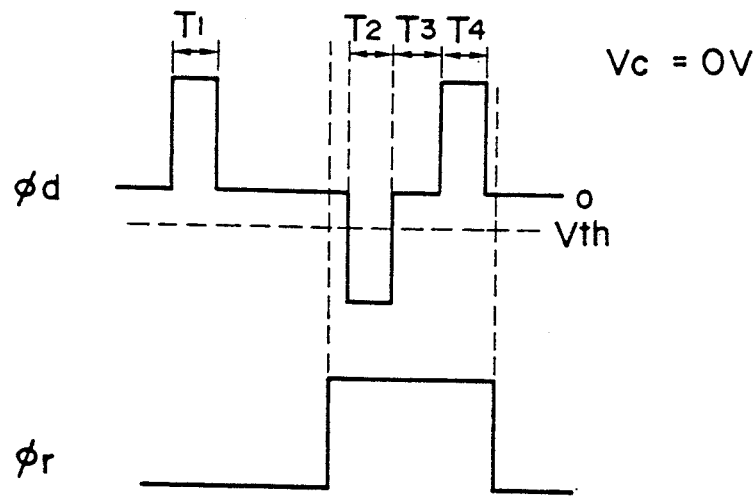
FIGS. 3A, 3B and 3C are timing charts showing examples of the function of said embodiment.
Figure 3B:
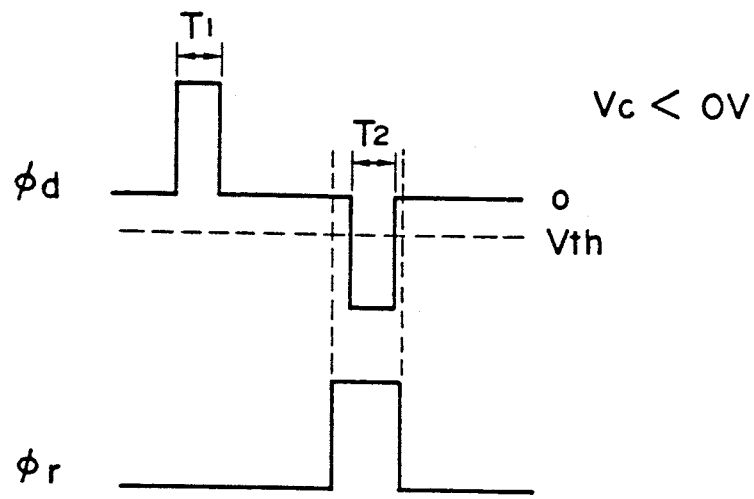
Figure 3C:
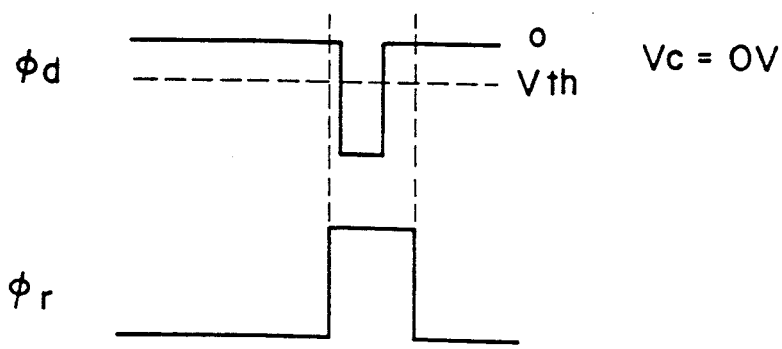

FIGS. 3A to 3C are timing charts showing examples of the function of the present embodiment.

At first reference is made to FIG. 3A, in which the constant potential is assumed equal to the ground potential, and it is also assumed that the p-type base area of each cell stores carriers by the accumulating operation.

At first the pulse $\phi d$ is shifted to a high level, for a duration T1, to supply a positive voltage to the electrodes 101 of the cells. As the pulse $\phi r$ is at the low level, the transistors Qb1-Qbn are turned off whereby the emitter electrodes 8 of the cells are in a floating state. The MOS transistors Tr are turned off in this state by the positive potential of the electrodes 101. Consequently the potential of the p-type base areas 4 is elevated through the capacitors Cox, whereby the reading operation explained before is conducted. The emitter outputs of all the cells S1-Sn are once stored in the capacitors and are subsequently read in succession by scanning pulses from the control unit 107.

Then the pulse $\phi r$ is shifted to the high level to turn on the transistors Qb1-Qbn, thus grounding the emitter electrodes 8 of the cells.

Then the pulse $\phi d$ is shifted to a negative potential to turn on the MOS transistors Tr of the cells and the MOS transistor Qx, thereby mutually connecting all the p-type base areas 4. Thus, in a period T2, the base areas are uniformly shifted to the ground potential Vc regardless of the accumulated potentials therein.

When the pulse $\phi d$ is shifted up to the ground potential after the period T2, the base potential is elevated to a positive value, by an amount determined by capacity division.

Thus the carriers accumulated in the p-type base area 4 are dissipated in a period T3, but this refreshing operation does not restore the initial state with a negative base potential (inverse bias between base and emitter). The refreshing operation is in fact conducted by a subsequent shift of the pulse $\phi d$ to a positive potential, and the base potential assumes the initial negative state when the pulse $\phi d$ is lowered after a period T4. The accumulating operation is subsequently initiated, and the above-explained operations are thereafter repeated.

Since the refreshing operation is conducted in the periods T3 and T4 after the base areas are controlled to the constant potential Vc by turning on the MOS transistors Tr by the pulse $\phi d$, the base potential after refreshing can be securely brought to a constant level regardless of the potential before refreshing.

Also except for the period T2, the cells are electrically separate as the MOS transistors are turned off. The electric separation of the cells can be achieved in this manner without the conventional separating areas, thus contributing to the miniatuarization of the cell structure.

FIG. 3B shows a driving method in which the potential Vc is fixed at a negative value, and the refreshing pulse is not applied. In this method, the base areas are initialized to the negative potential Vc by shifting the pulse $\phi d$ to a negative potential in the period T2 when the MOS transistors Tr are turned on. Therefore the accumulating operation can be started without the application of the refreshing pulse. The reading operation can be conducted in the same manner as in FIG. 3A FIG. 3C shows a driving method suitable for line sensor, in which the outputs are obtained by the function of phototransistors.

At first the Vc is fixed at the ground potential, and pulse φd is shifted to negative value to turn on the MOS transistors Tr, thereby bringing the base areas to the ground potential. The base potential is elevated to a positive value by the shift of the pulse φd to the ground potential. The refreshing operation is conducted while the emitter electrodes 8 are grounded by the pulse φr, and the accumulating and reading operations are initiated simultaneous with the shift of the emitter electrodes to the floating state at the downshift of the pulse φr.

Figure 4:
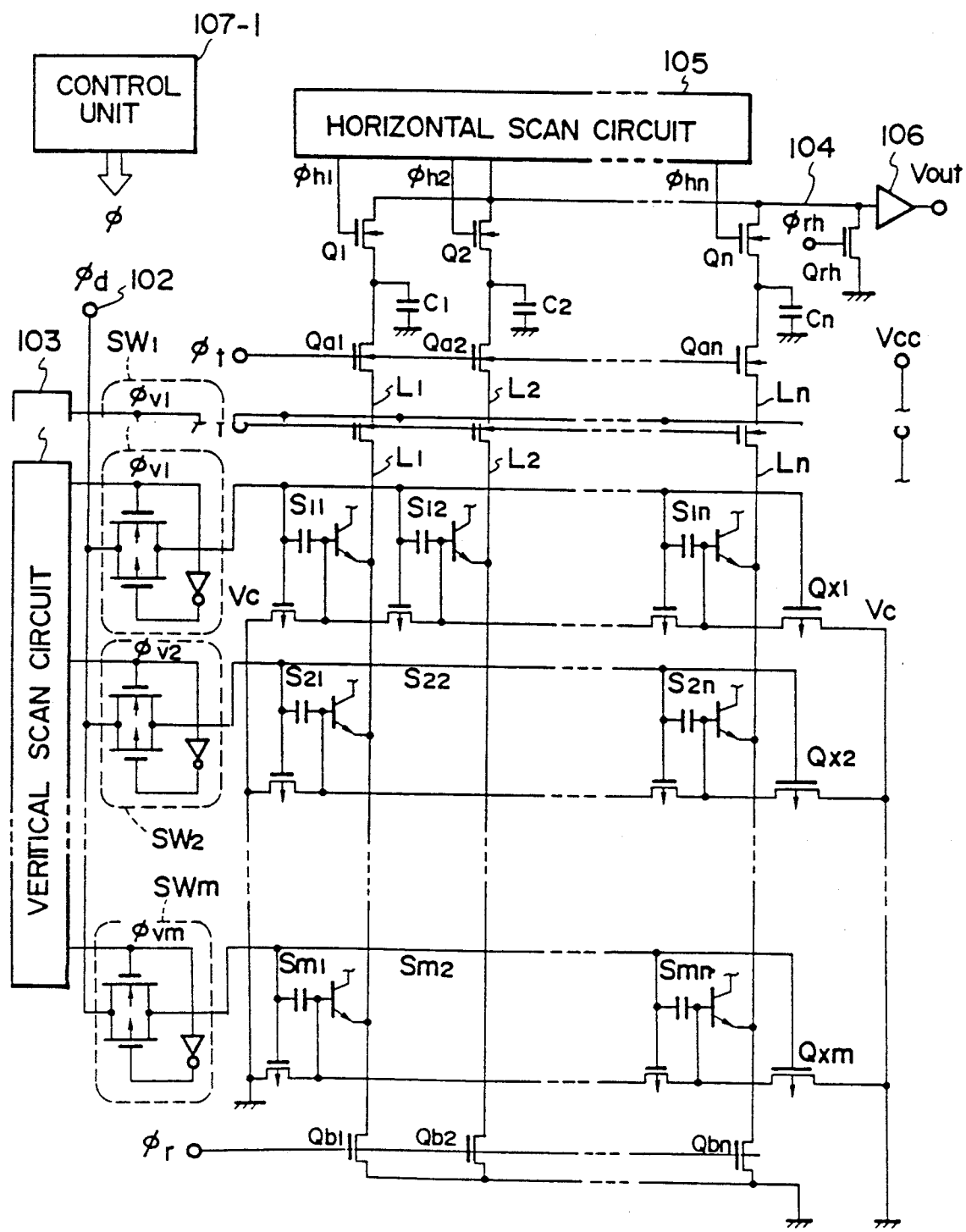
FIG. 4 is a schematic circuit diagram of a second embodiment of the present invention.
Figure 6A:
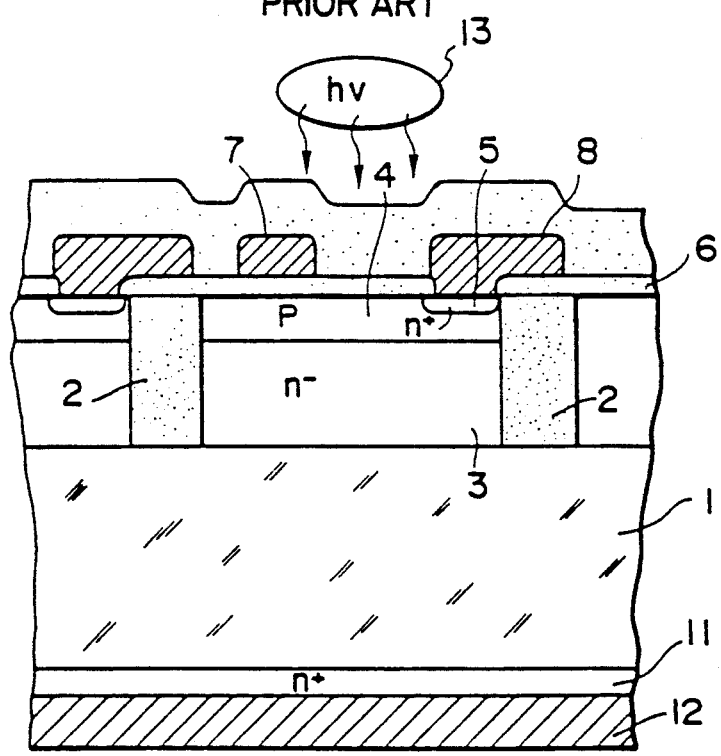
FIG. 6A is a schematic cross-sectional view of a photoelectric conversion device disclosed in the Japanese Laid-open Patent Gazettes Nos. 12759-12765/1985.
Figure 6B:
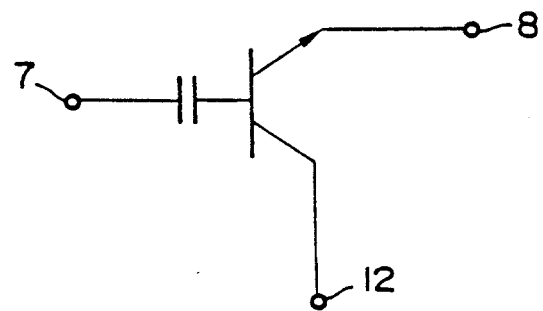
FIG. 6B is an equivalent circuit diagram of a photoelectric conversion cell thereof.
Figure 6C:
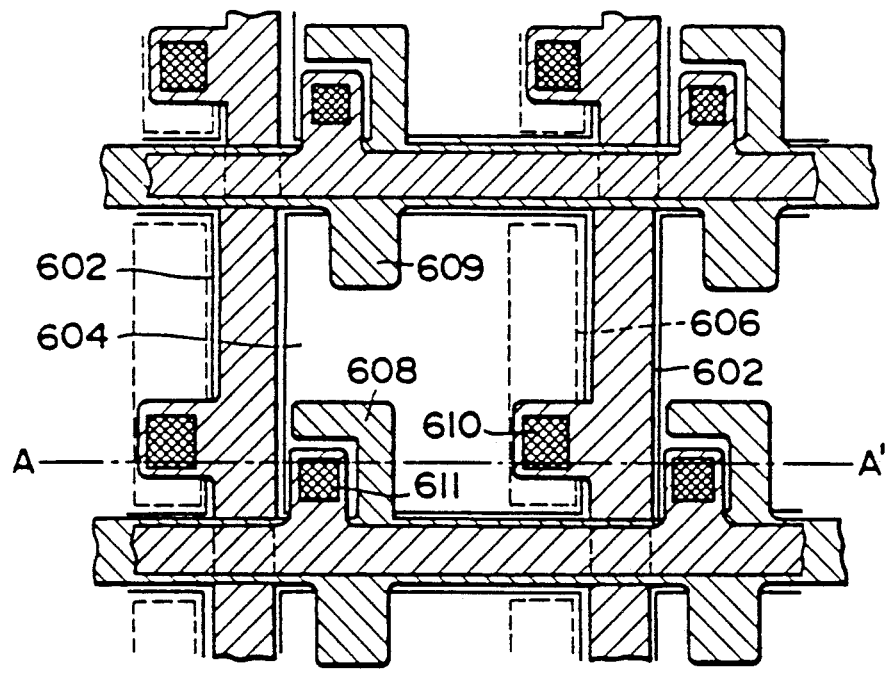
FIG. 6C is a schematic plan view of a photoelectric conversion apparatus disclosed in said patent references.
Figure 6D:
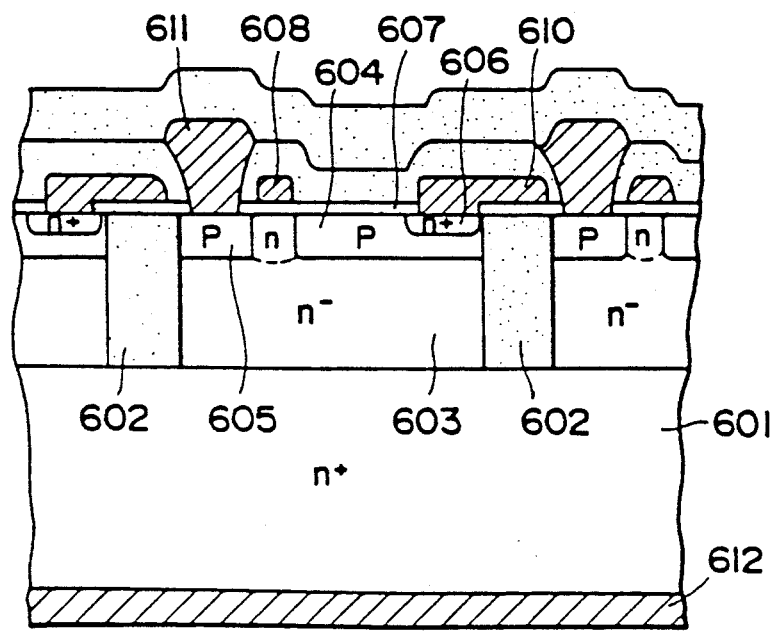
FIG. 6D is a cross-sectional view thereof along a line A—A'.
Figure 6E:
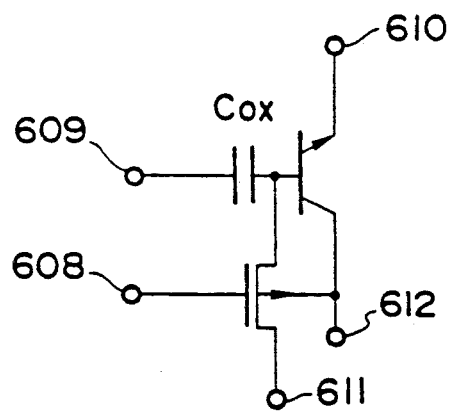
FIG. 6E is an equivalent circuit diagram thereof.
Figure 6F:
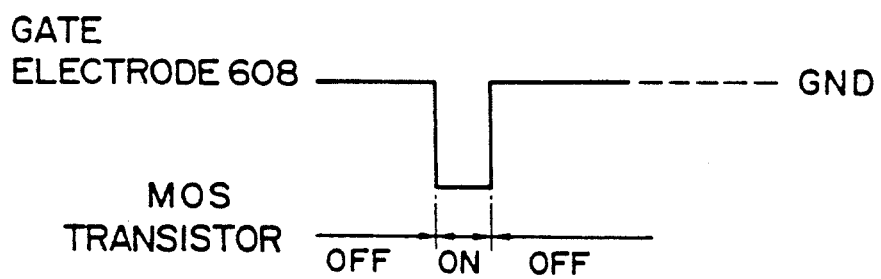
FIGS. 6F and 6G are wave form charts explaining a refreshing operation.
Figure 6G:
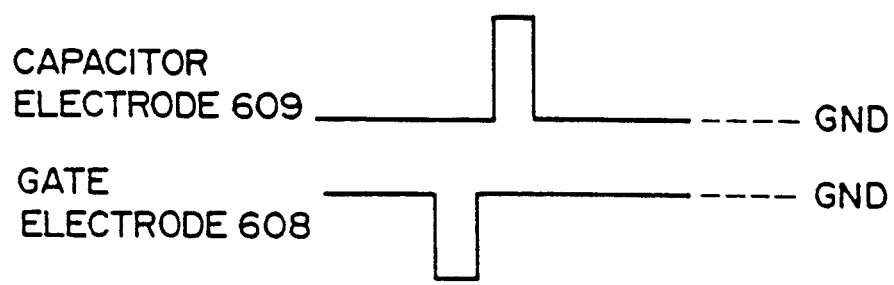

FIG. 4 is a schematic circuit diagram of a second embodiment of the present invention, consisting of an area sensor of m×n pixels, composed of an array of m lines of the line sensors shown in FIG. 2. Each line has a structure shown in FIG. 1, but the lines are electrically separated by ordinary separating areas.

The electrodes 101 of the cells in each line are commonly connected, and those of different lines are connected, respectively through switches SW1–SWm, to a terminal 102 receiving a pulse φd.

The switches SW1–SWm, consisting of analog switches, have control terminals connected to output terminals of a vertical scanning circuit 103, of which output signals φv1–φvm control the on/off state of said switches.

The emitter electrodes 8 of the cells are connected, column by column, to vertical lines L1–Ln, which are grounded respectively through resetting transistors Qb1–Qbn having gate electrodes for receiving a pulse φr.

The vertical lines L1–Ln are respectively connected, through transistors Qa1–Qan, to accumulating capacitors C1–Cn, which are connected to an output line 104 through transistors Q1–Qn.

A pulse φt is commonly supplied to the gate electrodes of the transistors Qa1–Qan, and pulses φh1–φhn are respectively supplied from a horizontal scanning circuit 105 to the gate electrodes of the transistors Q1–Qn.

The output line 104 is grounded through a transistor Qrh, and is connected to the input terminal of an amplifier 106. The gate electrode of said transistor Qrh receives a pulse φrh.

The above-mentioned pulses φ are supplied by a control unit 107 - 1.

In the present embodiment, the constant potential Vc for setting the base potential of the cells is selected equal to the ground potential.

In the following there will be briefly explained the function of the present embodiment.

FIG. 5 is a partial timing chart sowing an example of driving method of the present embodiment, according to the driving method shown in FIG. 3A.

At first the vertical scanning circuit 103 shifts the pulse φv1 alone to the high level to turn on the switch SW1. A pulse φv2 operates to turn on switch SW2 for the second line of the vertical scan to perform the same function with respect to the second line as pulse φv1 performs during the first line operation. Also the pulse φt is shifted to the high level to turn on the transistors Qa1–Qan.

Then the pulse φd is shifted to a positive potential during a period T1 to apply, through the switch SW1, a positive voltage to the electrodes 101 of the cells S11–S1n of the first line, whereby a reading operation is conducted in the first line and the read-out signals of the first line are accumulated, respectively through the vertical lines L1–Ln and the transistors Qa1–Qan, in the capacitors C1–Cn.

Then the pulse φt is shifted to the low level to turn off the transistors Qa1–Qan. Then the horizontal scanning circuit 105 releases the pulses φh1–φhn in succession, whereby the read-out signals accumulated in the capacitors C1–Cn are taken out in succession to the output line 104, and serially released to the outside as an output signal Vout through the amplifier 106. After the release of each read-out signal, the pulse φrh is shifted to the high level to turn on the transistor Qrh, thereby eliminating the carriers in the output line 104.

Simultaneous with this signal output operation, the pulse φr is shifted to the high level to turn on the transistors Qb1–Qbn, thereby grounding the vertical lines L1φLn. Also the pulse φd is shifted to a negative potential in the period T2, thereby turning on the MOS transistors Tr of the first line.

Thus the p-type base areas 4 of the cells S11–S1n are uniformly shifted to the ground potential as explained before, then returns to the initial negative potential by the refreshing operation in the periods T3 and T4, and start the accumulating operation.

After the completion of the operation of the first line in this manner, the pulse φv1 is shifted to the low level to turn off the switch SW1. Subsequently the pulse φt is shifted to the high level to turn on the transistors Qa1–Qan thereby eliminating the carriers remaining in the capacitors C1–Cn, through the vertical lines L1–Ln and the transistors Qa1–Qan.

The above-explained operation is repeated for each line to release the read-out signals from 2nd to m-th lines.

Also in the present embodiment, the refreshing operation is conducted in the periods T3 and T4 after the base potential of the cells of different lines is brought to a constant value in the period T2, so that there can be obtained an image sensor device with satisfactory retentive image characteristic and satisfactorily linear photoelectric conversion characteristic. In addition, the structure, not requiring the separating areas in the direction of lines, is suitable for miniaturization of the cells, and is easily capable of achieving a high resolution.

The photoelectric conversion apparatus of the foregoing embodiments have, as explained above, insulated gate transistors each having main electrodes composed of the semiconductor areas of neighboring cells, and are capable of shifting the semiconductor areas of said cells easily to a constant potential regardless of the amount of accumulated carriers, by turning on said gate-insulated transistors, thereby resolving the drawback of retentive image and improving the linearity of the photoelectric conversion characteristic.

Also the photoelectric conversion cells can be electrically separated with the conventional separating areas by turning off said gate-insulated transistors. The structure can therefore simplify the manufacturing process, and is suitable for the miniaturization of the device.

In the following there will be explained a third embodiment of the electrode pattern of the present invention.

Figure 7A:
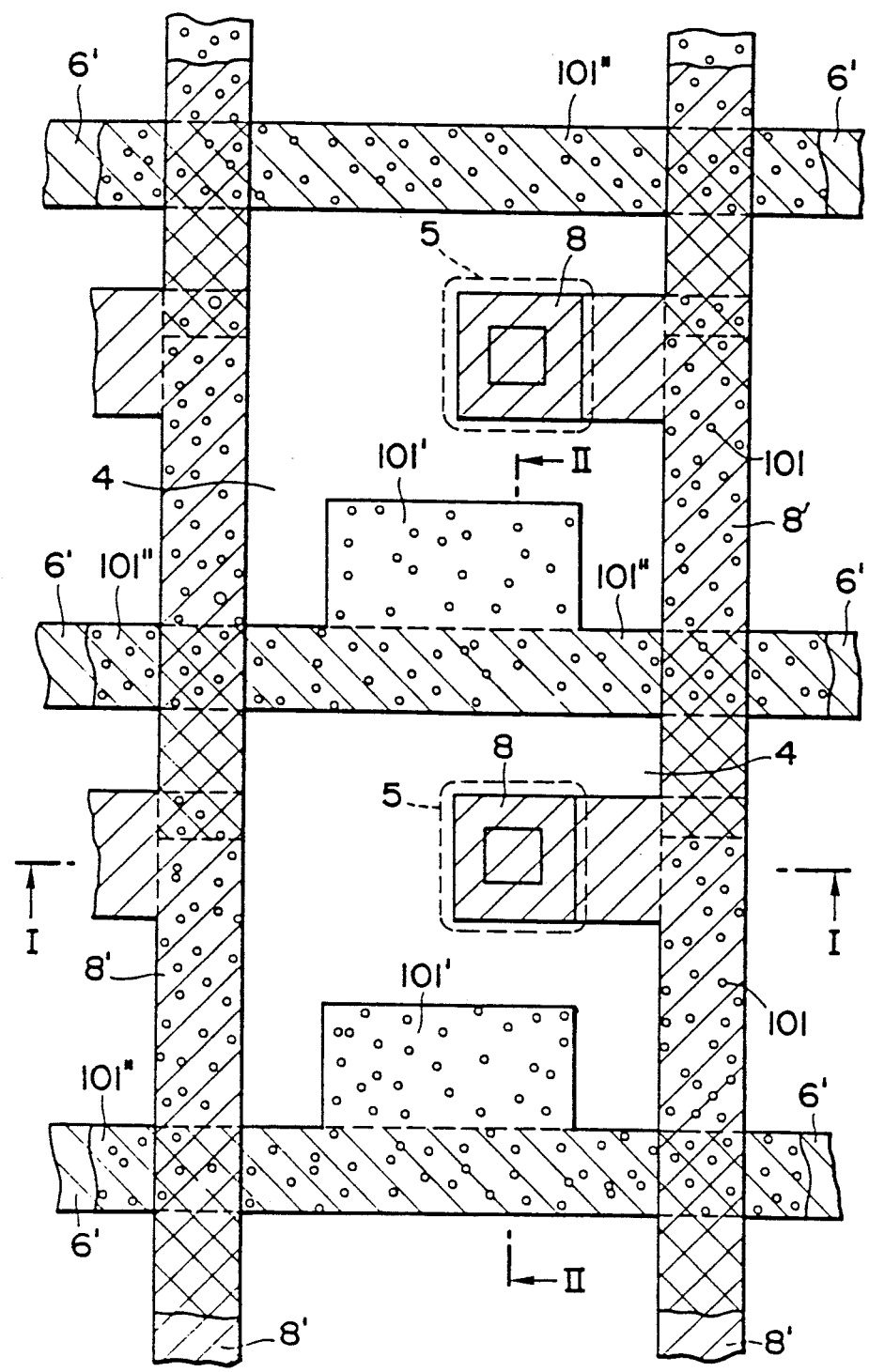
FIG. 7A is a schematic plan view of a third embodiment of the electrode pattern of the photoelectric conversion apparatus of the present invention.
Figure 7B:
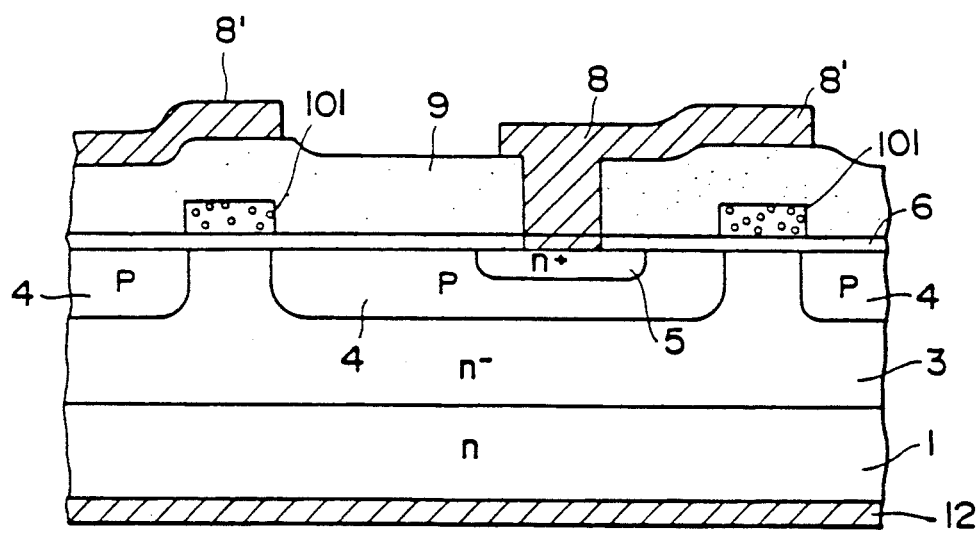
FIG. 7B is a cross-sectional view along a line I—I.
Figure 7C:
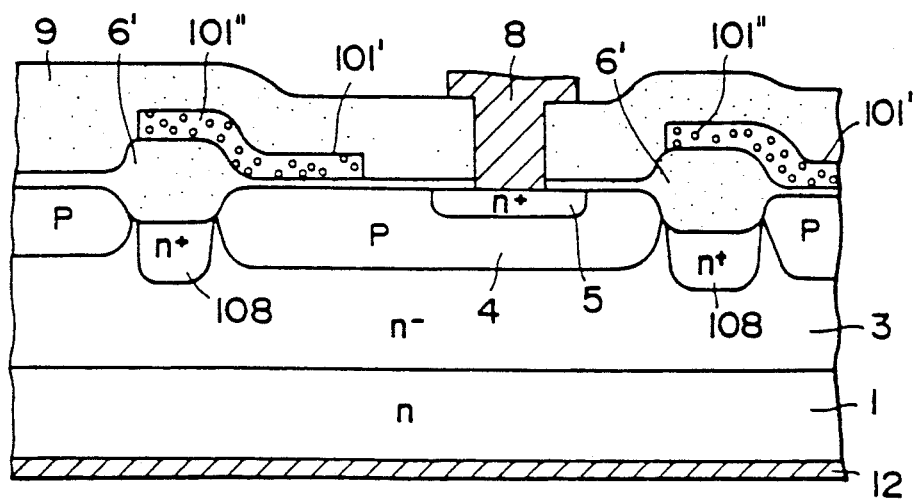
FIG. 7C is a cross-sectional view along a line II—II.

FIG. 7A is a schematic plan view of a third embodiment of the electrode pattern of the photoelectric conversion apparatus of the present invention, and FIGS. 7B and 7C are respectively cross-sectional views thereof along a line I—I and a line II—II. In these drawings, same components as those in FIGS. 1 to 6 are represented by same numbers.

In FIGS. 7A to 7C, an $n^-$-type layer 3 constituting a collector area is formed by epitaxial growth on an n-type silicon substrate 1, and p-type base areas 4 and $n^+$-type emitter areas 5 are formed therein to constitute bipolar transistors.

The p-type base areas 4 are two-dimensionally arranged as shown in FIG. 7A, and the cells in the horizontal line are separated from those in the upper and lower lines by separating areas, which are composed, as shown in FIG. 7C, of an oxide film 6' formed by LOCOS oxidation and an $n^+$-type area 108 formed thereunder.

Also bridging the p-type base areas 4 neighboring in the horizontal direction, a gate electrode 101 is formed on an oxide film 6 as shown in FIG. 7B. Consequently a p-channel MOS transistor is formed, with the source and drain composed of the neighboring p-type base areas 4.

Said MOS transistor, being of normally-off type, is turned off when the gate electrode 101 is at the ground potential or a positive potential, thereby electrically separating the p-type base areas of the neighboring cells. On the other hand, if the gate electrode 101 is given a negative potential exceeding a threshold value Vth, said transistor is turned on to mutually connect the p-type base areas 4 of the cells.

As shown in FIG. 7A, the gate electrodes 101 are commonly connected, in the unit of each line, to a driving line 101", to which likewise connected are capacitor electrodes 101' for controlling the potential of the p-type base areas 4. The driving line 101" extends horizontally over the oxide film 6' constituting the separating areas.

After the formation of transparent insulating layers 9, there are formed emitter electrodes 8 which are connected, column by column, to vertical lines 8'. A collector electrode 12 is formed on the bottom face of the substrate 1, across an ohmic contact layer.

The area sensor of the present embodiment does not require particular wirings for complete refreshing. Thus the area sensor requires, for driving, a vertical scanning pulse $\phi$d and a resetting pulse $\phi$r.

Also the absence of the MOS transistor, for complete refreshing, on the light receiving surface enables a high speed operation with sacrificing the aperture ratio.

Also the common connection of the gate electrodes and the capacitor electrodes enables to achieve a high speed operation with a limited number of driving pulses.

Figure 8:
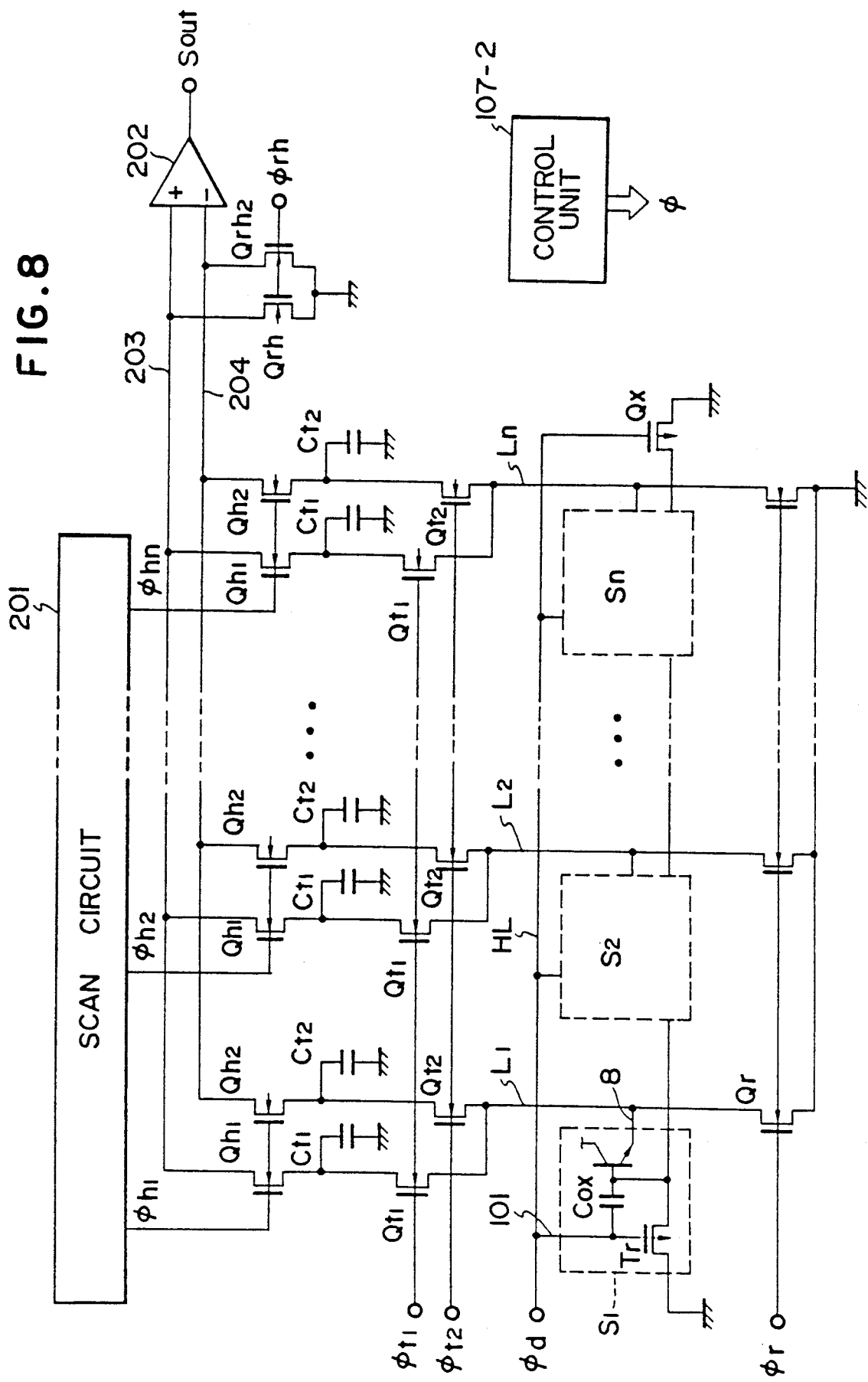
FIG. 8 is a circuit diagram of a fourth embodiment of the photoelectric conversion apparatus of the present invention.

FIG. 8 is a circuit diagram of a fourth embodiment of the photoelectric conversion apparatus of the present invention.

As shown in FIG. 8, the emitter electrodes 8 of cells Sl–Sn of the apparatus are respectively connected to vertical lines Ll–Ln which are respectively grounded through transistors Qr. Each of the vertical lines Ll–Ln is connected respectively through transistors Qt1 and Qt2 to accumulating capacitors Ct1, Ct2, which are respectively connected, through transistors Qh1, Qh2, to output lines 203, 204.

The gate electrodes of the transistors Qr receive a pulse $\phi$r, while the gate electrodes of the transistors Qt1, Qt2 respective receive pulses $\phi$t1, $\phi$t2, and the gate electrodes of the transistors Qh1, Qh2 receive scanning pulses $\phi$h1, $\phi$h2 from a scanning circuit 201.

The output lines 203, 204 are connected to a differential amplifier 202, and are grounded respectively through transistors Qrh1, Qrh2 receiving a resetting pulse $\phi$rh at the gate electrodes thereof. Said pulses $\phi$ are released by a control unit 107 - 2.

Figure 9:
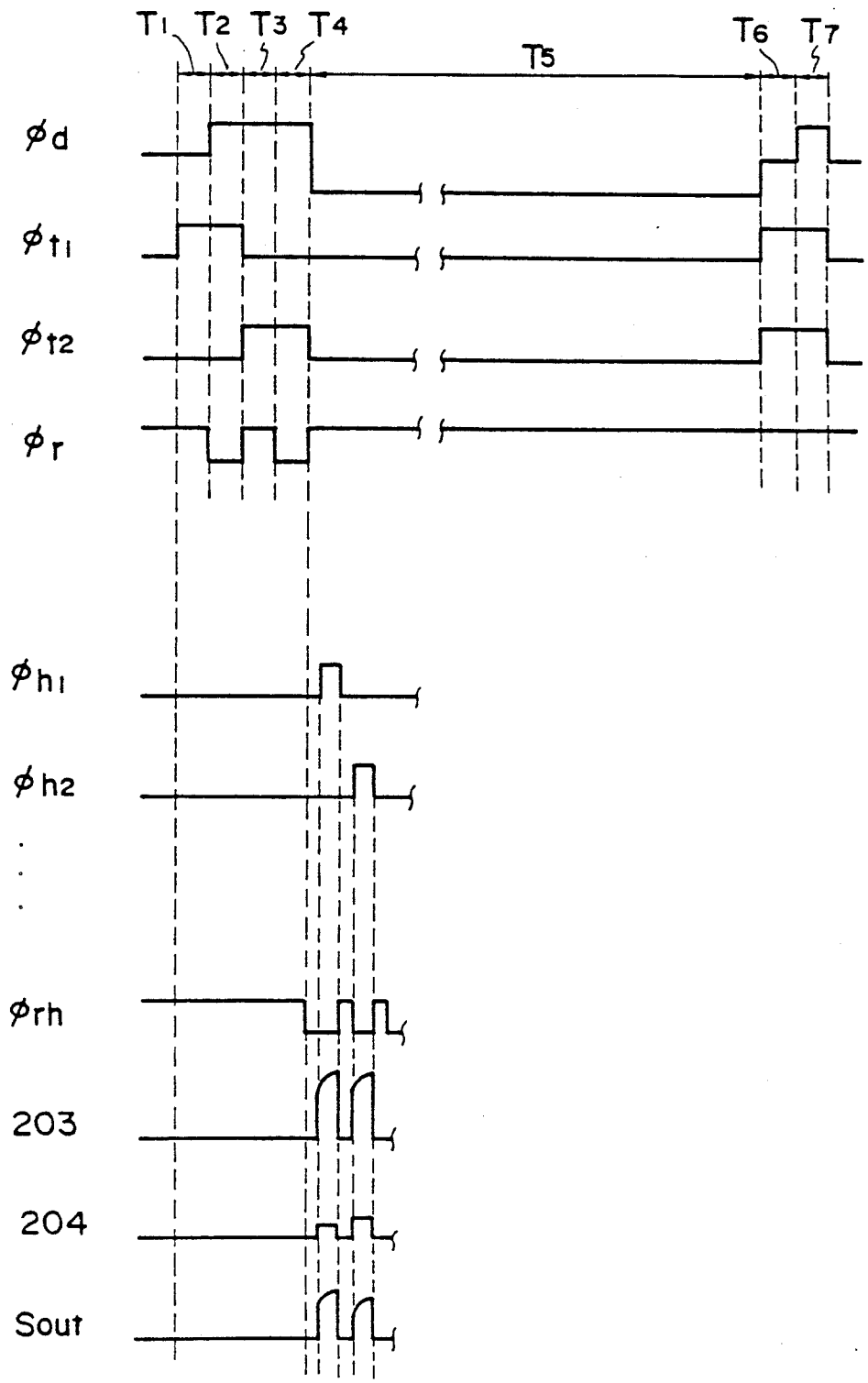
FIG. 9 is a timing chart showing the function of said embodiment shown in FIG. 8.

Now reference is made to a timing chart in FIG. 9 for explaining the function of the above-explained photoelectric conversion device.

At first the transistors Qt1, Qr are turned on by the pulses $\phi$t1, $\phi$r in a period T1 to discharge the capacitors Ct1 to the ground potential.

Then the pulse $\phi$d is supplied to the horizontal line HL while the transistors Qt1 are turned on to bias the transistors of the photoelectric conversion cells Sl–Sn in the forward direction, whereby the read-out signals are accumulated in the capacitors Ct1 (period T2).

Subsequently the cells Sl–Sn are refreshed by turning on the transistors Qr with the pulse $\phi$r while the pulse $\phi$d is applied. Simultaneously the transistors Qt2 are turned on by the pulse $\phi$t2 to discharge the capacitors Ct2 to the ground potential (period T3).

Upon completion of the refreshing operation, the transistors Qr are turned off by the pulse $\phi$r while the pulses $\phi$d and $\phi$t2 are applied, whereby the signals remaining in the cells Sl–Sn after refreshing are accumulated in the capacitors Ct2 (period T4).

After the read-out signals and the retentive signals of the cells Sl–Sn are accumulated in the capacitors Ct1, Ct2, the scanning circuit 201 supplies the pulse $\phi$h1 to the gate electrodes of the transistors Qh1, Qh2, whereby the read-out signal and the retentive signal of the cell Sl, respectively accumulated in the capacitors Ct1, Ct2 appear on the output lines 203, 204 and are processed by the differential amplifier 202. The read-out signal appearing on the output line 203 contains unnecessary signals which however are removed in the process by the differential amplifier. After the release of the output of the cell Sl, the resetting pulse $\phi$rh turns on the transistors Qrh1, Qrh2 to eliminate the charges remaining on the output lines 203, 204. Thereafter the pulses $\phi$h2$\phi$hn cause the read-out signals and retentive signals of the cells S2–Sn to be transferred from the capacitors Ct1, Ct2 to the output lines 203, 204, whereby output signals Sout are obtained in succession from the differential amplifier 202. At the same time the pulse $\phi$r turns on the transistors Qr to ground the emitter electrodes 8 of the cells Sl–Sn, and the pulse $\phi$d is shifted to a negative potential to turn on the MOS transistors Tr, thereby connecting the base areas of all the cells. Thus the base areas of the cells are uniformly brought to the ground potential regardless of the accumulated potentials thereof (period T5).

Then by a shift of the pulse $\phi$d to the ground potential, the base potential is elevated by the capacity division to assume a positive value. Consequently the carriers accumulated in the base area are dissipated, but this refreshing operation does not bring the base potential to the initial negative state (inverse bias between the base and the emitter) (period T6).

Subsequently the refreshing operation is conducted by the shift of the pulse $\phi$d to a positive potential, and the base potential returns to the initial negative state at the end of said pulse (period T7).

Then the accumulating operation is started, and the above-explained steps are repeated.

The present embodiment, in which the refreshing operation is conducted in the periods T5 to T7 in addition to the period T3, can achieve further elimination of the retentive image and unnecessary signals, thereby providing an output signal of a high S/N ratio.

In a photoelectric conversion apparatus, in order to completely eliminate the retentive image and unnecessary signals and to obtain an output signal of a high S/N ratio, it is necessary to sufficiently conduct the refreshing operations before and after reading the retentive image signal. Also in the above-explained apparatus it is desirable to conduct a refreshing operation in the periods T5 to T7 before the reading of the retentive image signal, but an excessively long refreshing period before reading the retentive signal is not desirable. Particularly when the apparatus is to be used as an area sensor for a video camera, the refreshing operation requires a horizontal scanning period, so that the read-out signal has to be delayed by said period. For this purpose a corresponding memory capacity has to be formed in the chip of the device, thus inevitably increasing the size of the chip.

In addition the aforementioned driving method has a room for improvement in order to increase the correlation between the unnecessary signal and the retentive signal contained in the read-out signal, thereby further improving the S/N ratio.

Figure 10A:
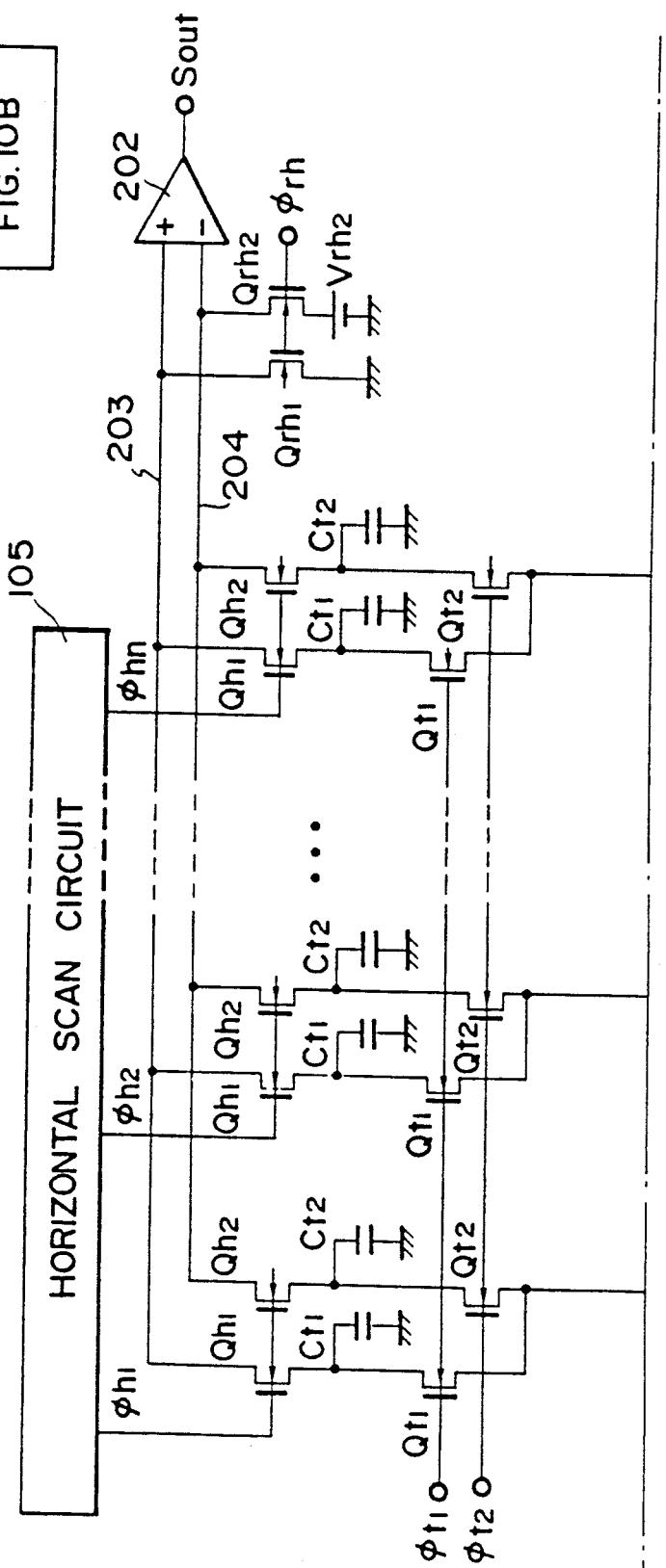
FIG. 10A is a circuit diagram of a fifth embodiment of the photoelectric conversion apparatus of the present invention.

FIG. 10 is a circuit diagram of a fifth embodiment of the present invention, wherein same components as those in FIG. 8 are represented by same numbers. In the present embodiment there is shown an area sensor of $m \times n$ pixels, composed of m lines of photoelectric conversion cells Sl-Sn as shown in FIG. 8.

As shown in FIG. 10, in each of horizontal lines HL1-HLm, electrodes 101 of the cells and the gate electrode of a transistor Qx are connected, through a transistor Qv, to a terminal 102 receiving a driving pulse $\phi d$. The gate electrodes of said transistors Qv of the horizontal lines HL1-HLm are respectively connected to output terminals of a vertical scanning circuit 103, thus receiving vertical scanning pulses $\phi v1-\phi vm$. Said vertical scanning circuit 103 and the transistors Qv of the horizontal lines constitute a vertical scanning unit.

The emitter electrodes 8 of the cells are connected, column by column, to vertical lines L1-Ln, which are connected, respectively through transistors Qr, to a power source Vr. A photosensor unit 206 is composed of said transistors Qr, cells Sll-Smn, and transistors Qx connected to the horizontal lines.

Also as shown in FIG. 8, each of the vertical lines L1-Ln is connected, respectively through transistors Qt1, Qt2, to capacitors Ct1, Ct2, which are respectively connected to output lines 203, 204 through transistors Qh1, Qh2. The gate electrodes of the transistors Qh1, Qh2 of the vertical lines L1-Ln respectively receive horizontal scanning pulses $\phi h1-\phi hn$ from a horizontal scanning circuit 105.

The output lines 203, 204 are connected to a differential amplifier 202, and are respectively connected, through transistors Qrh1, Qrh2, to the ground and to a power source Vrh2. The remaining structure is same as that shown in FIG. 8. The above-mentioned various pulses $\phi$ are supplied by a control unit 107 - 3.

Figure 11:
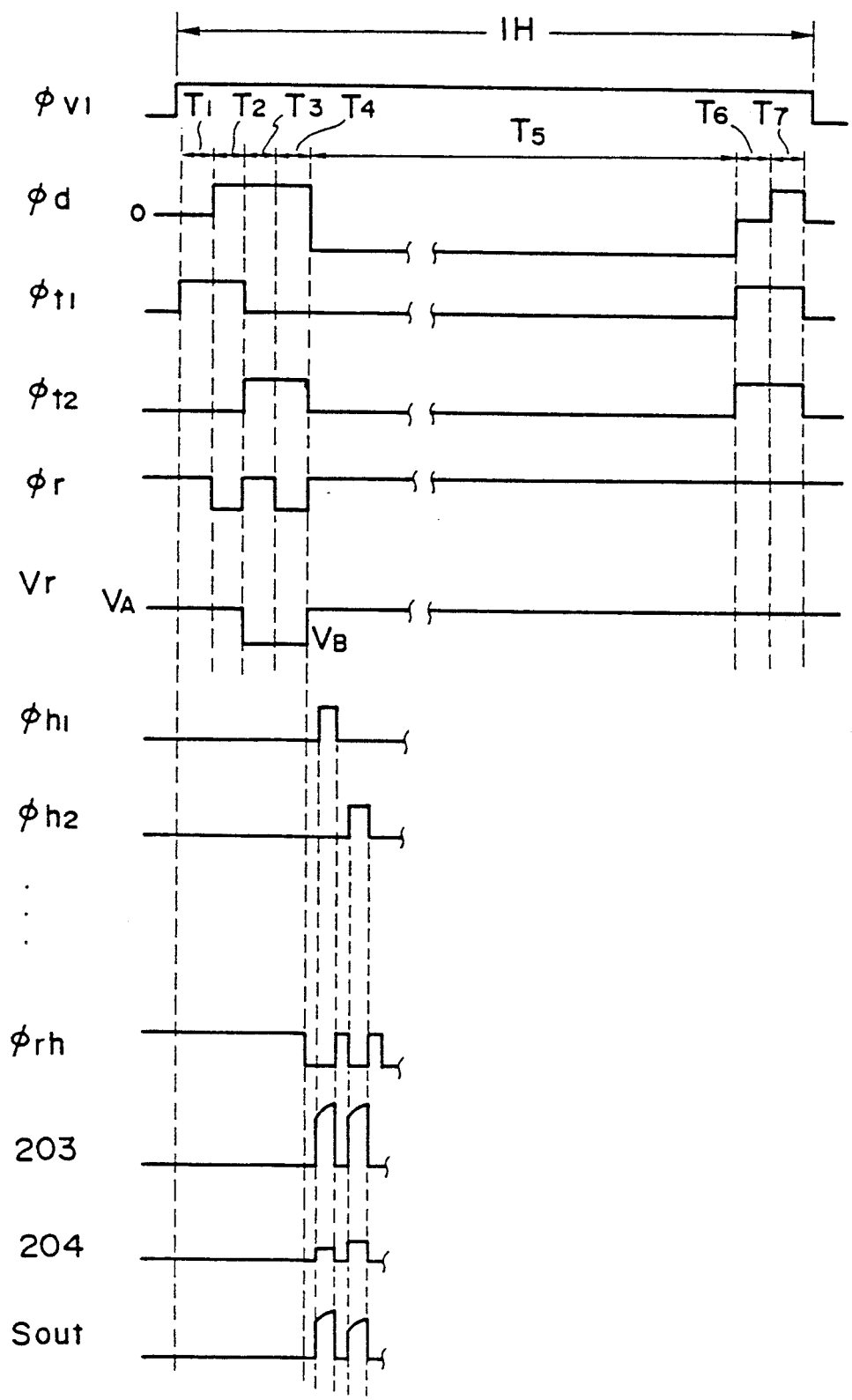
FIG. 11 is a timing chart showing the function of said embodiment shown in FIG. 10.

Now reference is made to a timing chart shown in FIG. 11 for explaining the function of the present embodiment. FIG. 11 only shows the function of a first horizontal line HL1. In FIG. 11, 1H indicates the horizontal scanning period of a television signal, and a period T5 corresponds to the effective scanning period thereof.

At first the vertical scanning circuit 103 releases the scanning pulse $\phi v1$ for a period 1H, thereby turning on the transistor Qv of the first horizontal line HL1.

Then the transistors Qt1 and Qr are turned on by the pulses $\phi t1$, $\phi r$ to discharge the capacitors Ct1 to the potential $V_A$ of the power source Vr (period T1).

Then the pulse $\phi d$ is applied while the transistors Qt1 are turned on to bias the cells Sll -Sln in the forward direction, whereby the read-out signals are stored in the capacitors Ct1 (period T2).

Subsequently the transistors Qt1 are turned o off while the pulse $\phi d$ is supplied, and the transistors Qr are turned on by the pulse $\phi r$. If the potential of the power source Vr is reduced from $V_A$ to $V_B (V_B < V_A)$, the cells Sll—Sln are subjected to a transient refreshing under a deeper forward biasing than in the period T2. Also the transistors Qt2 are turned on by the pulse $\phi t2$ to discharge the capacitors Ct2 to the potential $V_B$ of the power source Vr (period T3).

The operations in the subsequent periods T4 -T7 are same as those shown in FIG. 9. The resetting potential Vrh2 of the output line 204 is selected equal to $K(V_A - V_B)$, wherein $K = Ct2/(Ct2 + Ch2)$ in which Ch2 is the line capacitance of the output line 204, in order to have a same reference potential for comparison, for the capacitors Ct1 discharged to the potential $V_A$ in the period T1 and for the capacitors Ct2 discharged to the potential $V_B$ in the period T3.

The foregoing operations are thereafter repeated for other lines to obtain the read-out signals for the horizontal lines HL2-HLm in succession.

As explained in the foregoing, it is rendered possible to eliminate the retentive image component and the unnecessary signals in the cells and to improve the S/N ratio through a short refreshing operation, by reducing the potential of the power source Vr in the transient refreshing period T3 before reading the retentive signal, thereby sufficiently biasing the photoelectric conversion cells in the forward direction.

It is also possible to modify the forward bias state by varying the potential of the pulse $\phi d$ while maintaining the power source Vr at a constant value.

Figure 12:
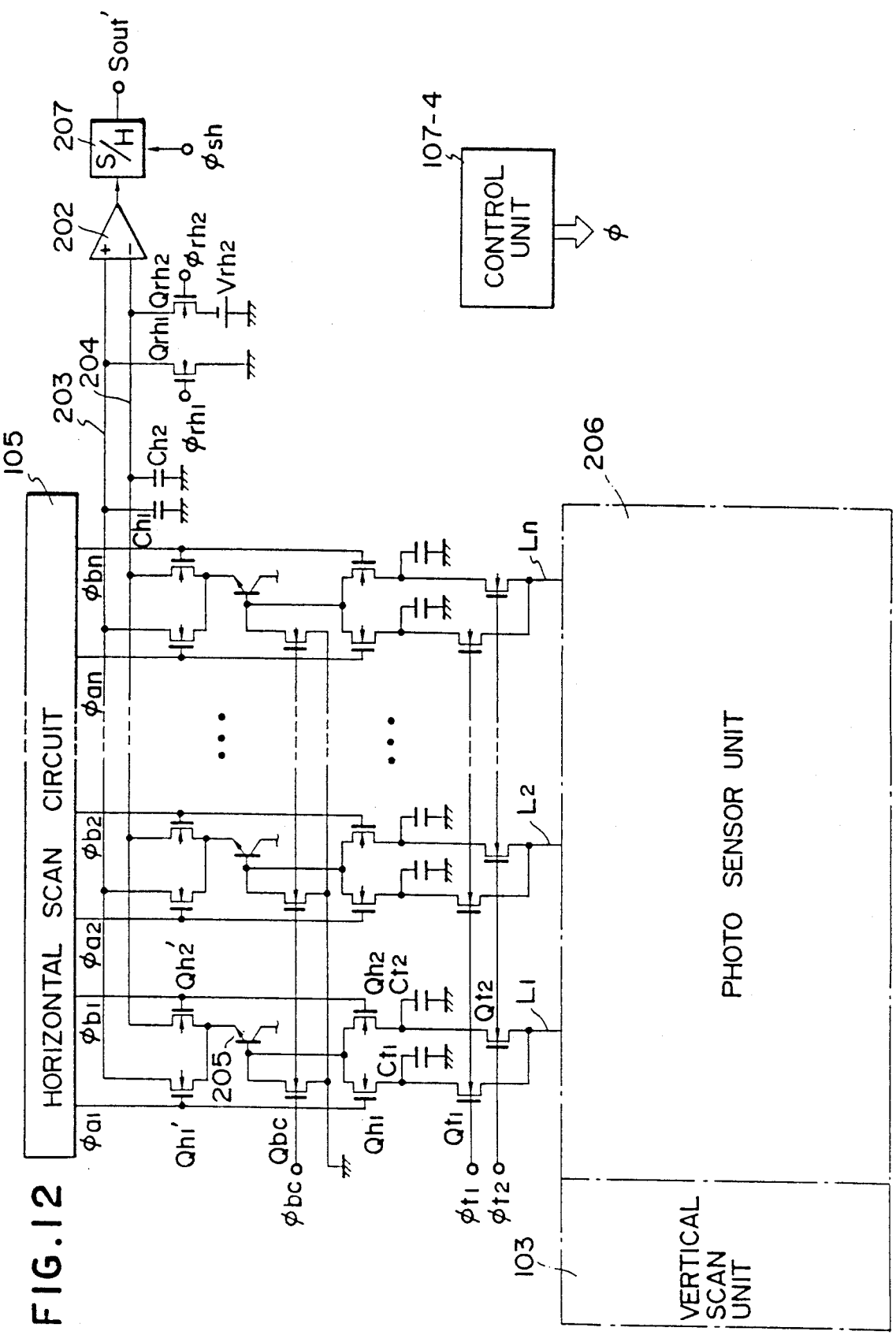
FIG. 12 is a circuit diagram of a sixth embodiment of the present invention.

FIG. 12 is a circuit diagram of a sixth embodiment of the present invention, wherein the vertical scanning unit and the photosensor unit 206 are omitted as they are same as those in FIG. 10.

In the present embodiment, between the scanning transistors Qh1, Qh2 and the output lines 203, 204 there is provided a buffer amplifier 205, consisting of a bipolar transistor, for preventing the level loss of the signals of the capacitors Ct1, Ct2 caused by the line capacitances Ch1, Ch2 when said signals are read to the lines 203, 204, and for enabling a high-speed scanning.

The base electrode of the amplifier 205 is commonly connected to the transistors Qh1, Qh2 and is grounded through a transistor Qbc driven by a pulse $\phi bc$. The emitter of said amplifier is connected, respectively through second scanning transistors Qh1', Qh2', to the output lines 203, 204. Said transistors Qh1', Qh2' are driven, together with the transistors Qh1, Qh2, by two-phase horizontal scanning pulses $\phi a$ ($\phi a1-\phi an$) and $\phi b$ ($\phi b1-\phi bn$). The collector of said amplifier receives a constant positive voltage.

The output lines 203, 204 are respectively connected to the ground and to a power source Vrh2, respectively through transistors Qrh1, Qrh2, of which gate electrodes respectively receive resetting pulses φrh1, φrh2. The output terminal of the differential amplifier 202 is connected to a sample hold circuit 207 for sampling the input signal in response to a pulse φsh. The remaining structure is same as that shown in FIG. 10. The various pulses φ are supplied by a control unit 107 - 4.

Figure 13:
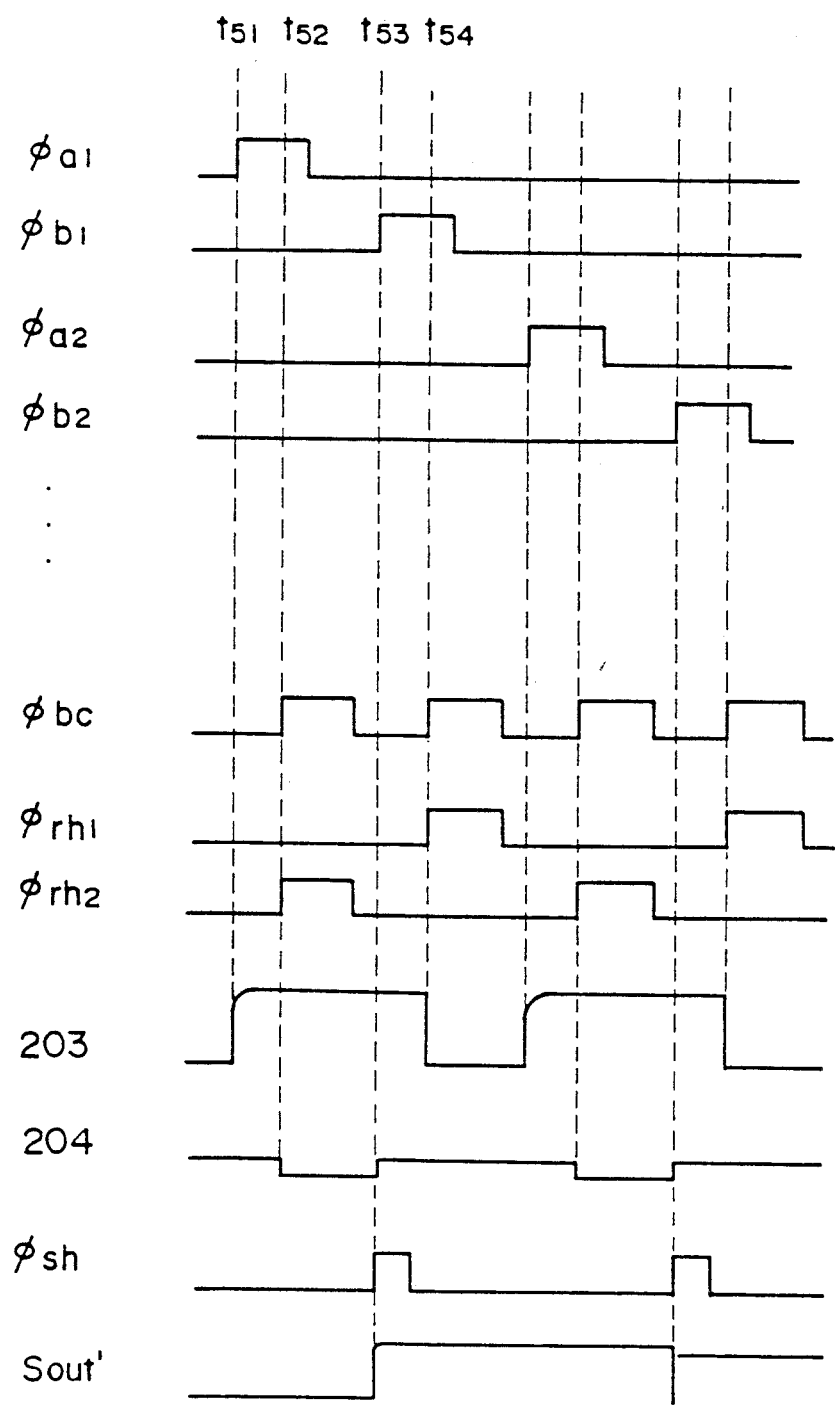
FIG. 13 is a timing chart showing the function of the circuit shown in FIG. 12.

The function of the present embodiment will be explained in reference to FIG. 13 which shows the function in the period T5 only. Other periods are omitted as they are same as in FIG. 11

At first, at a time $t_{51}$, the first pulse φal of said two-phase scanning pulses turns on the transistors Qh1 and Qh1', whereby the read-out signal accumulated in the capacitor Ct1 is supplied to the output line 203 and accumulated in the line capacitance Ch1.

Then, at a time $t_{52}$, the pulse φbc turns on the transistor Qbc, thereby dissipating the charges remaining in the capacitor Ct1 and the base electrode of the amplifier 205. The signal accumulated in the line 203 remains unchanged since, in this state, the amplifier 205 is inversely biased and is therefore non-conductive. Also the pulse φrh2 turns on the transistor. Qrh2, thereby clearing the output line 204 to the potential Vrh2.

Said potential Vrh2 is selected equal to $-(V_A-V_B)$, in order to have a constant bias for the amplifier 205, in releasing the readout signal of the capacitor Ct1 to the output line 203 and in releasing the readout signal of the capacitor Ct2 to the output line 204.

Then, at a time $t_{53}$, the second pulse φbl of the two-phase scanning pulses turns on the transistors Qh2 and Qh2' whereby the retentive signal accumulated in the capacitor Ct2 is released to the output line 203 and accumulated in the line capacitance Ch2. Consequently the differential amplifier 202 receives the signals accumulated in the capacitors Ct1 and Ct2, and the output signal Sout of said amplifier is sampled in the simple hold circuit 206 by the pulse φsh and released as an output signal Sout'.

At a time $t_{54}$, the pulse φbc turns on the transistor Qbc to dissipate the charges remaining in the capacitor Ct2 and the base electrode of the amplifier 205. Also the pulse φrh1 turns on the transistor Qrh1, thereby clearing the output 203 to the ground potential.

Thereafter the signals of the capacitors Ct1, Ct2 are released in succession by the horizontal scanning pulses φa2,φb2–φan, φbn from the horizontal scanning circuit 105.

In the present embodiment, therefore, the presence of buffer amplifiers enable direct driving of the output lines and a high-speed transfer of the signals without level loss.

In the foregoing description, the photoelectric conversion elements are composed of gate-separated sensors, but they can also be composed of elements of base accumulation type as disclosed in the Japanese Laid-open Patent Gazette No. 12759/1985. In such case it is desirable to apply a deep forward bias to the elements by increasing the potential of the pulse φrc in the period T3 for transient refreshing.

The fifth and sixth embodiments of the present invention explained above are capable of providing an output signal of a high S/N ratio through a simple method of eliminating the dark signal and unnecessary signal such as driving noises of the photoelectric conversion elements from the read-out signal by subtracting the retentive signal after refreshing from the read-out signal of the photoelectric conversion elements, and of eliminating the retentive image component and unnecessary components in a short period by applying a deeper forward bias to said elements in the refreshing operation than in other process steps.

Figure 14A:
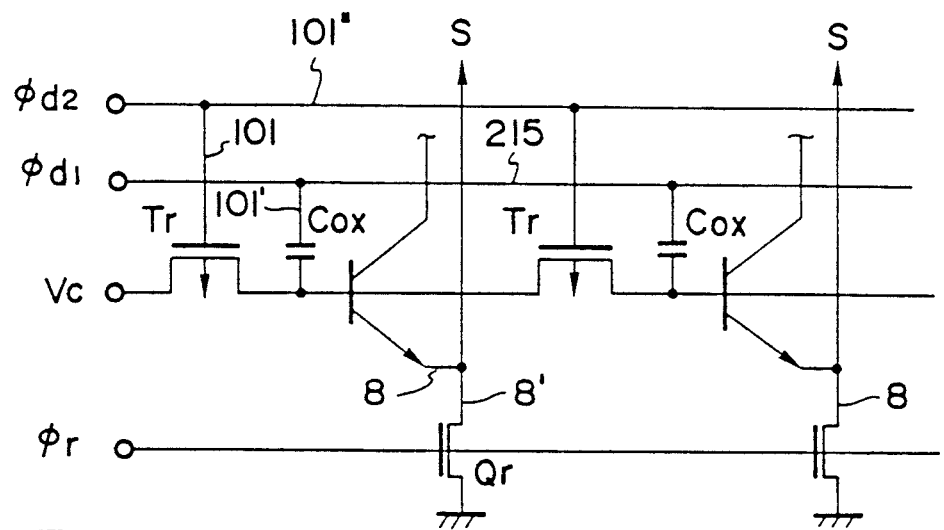
FIG. 14A is an equivalent circuit diagram of a seventh embodiment of the photoelectric conversion apparatus of the present invention.
Figure 14B:
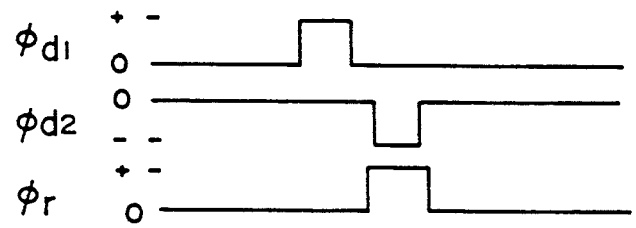
FIG. 14B is a timing chart showing the function thereof.

FIG. 14A is an equivalent circuit diagram of a seventh embodiment of the present invention, and FIG. 14B is a timing chart showing the function thereof.

The function of the present embodiment basically consists of the steps of accumulation, reading and refreshing as explained in relation to FIG. 3.

In the foregoing photoelectric conversion apparatus, however, the driving line 102 has to be given pulses φd for example of ±5V. Consequently, the vertical shift register in an area sensor has to withstand a voltage swing of ±10 V. The use of a thicker insulating film for withstanding inevitably increases the circuit area of said shift register. Particularly a shift register with a boost trap capacity requires a larger area in order to compensate the loss in capacity caused by the use of a thicker insulating film.

The present embodiment is proposed for resolving this drawback. More specifically, as shown in FIG. 14A, the electrode 101' of a capacitor Cox is connected to a driving line 215 receiving a pulse φd1, which is used for effecting the reading operation by applying a positive voltage to the capacitor Cox as explained before.

Also the gate electrode 101 of a MOS transistor Qr is connected to a driving line 101" receiving a negative voltage pulse φd2, which is for on/off control of the p-channel MOS transistor Qr and for resetting each p-type base area 4 to a constant potential in the refreshing operation, as explained before.

The reading operation is conducted by applying a positive voltage pulse φd1 to the driving line 215 as shown in FIG. 14B. Said positive voltage pulse φd1 elevates the potential of the P-type base area 4, thereby applying a forward bias between the base and the emitter and releasing the accumulated voltage to a vertical line 8' through the emitter electrode 8, thus obtaining a read-out signal S. The threshold voltage Vth of said p-channel MOS transistor Qr is so determined that it is turned off with a gate potential of 0V.

The refreshing operation is conducted in the following manner. A pulse φvc turns on the transistor Qvc, thereby grounding the vertical line 8' and eliminating the retentive charge. Simultaneously the p-channel MOS transistor Qr is turned on by a negative voltage pulse φd2, thereby completely refreshing the p-type base area 4.

Upon completion of the refreshing operation, the p-type base areas 4 return to the initial potential and start an accumulating operation for accumulating the photoexcited carriers. Thereafter the photoelectric converted signals are obtained through repeated cycles of reading, refreshing and accumulation.

In this manner, the use of a driving line 101" for applying the negative voltage pulse φd2 and another line 215 for applying the positive voltage pulse φd1 reduces the pulse amplitude in each line a half, thus reducing the burden of the driving system such as the shift register and avoiding the problem of voltage resistance.

Figure 15:
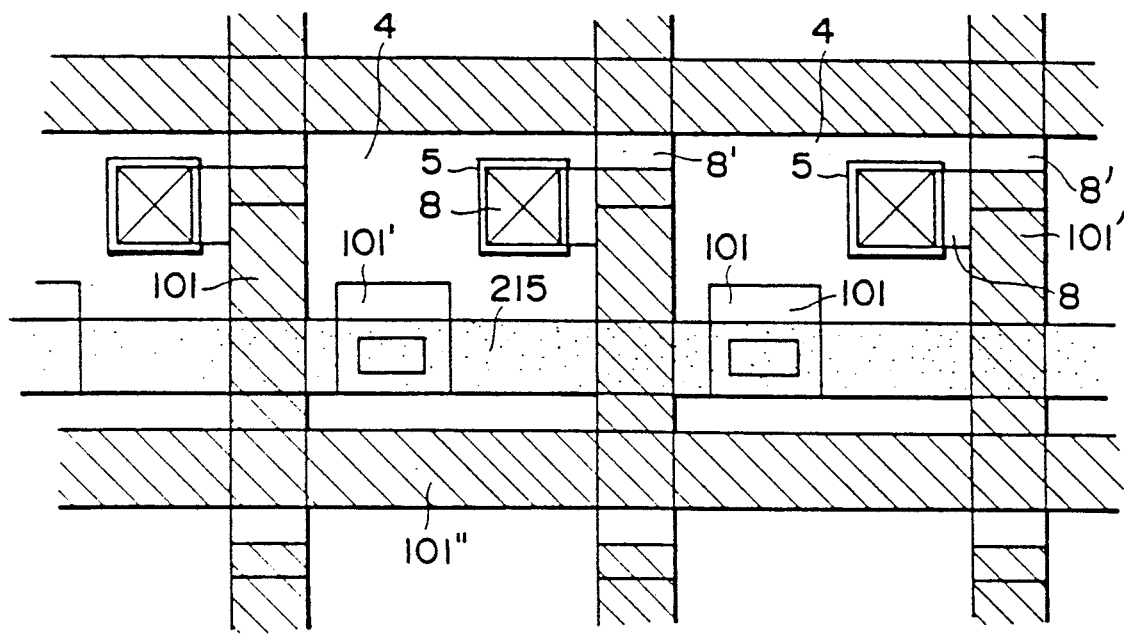
FIGS. 15 to 17 are schematic plan views respectively showing seventh to ninth embodiments of the present invention.

FIG. 15 is a schematic plan view of a seventh embodiment of the present invention, wherein components corresponding to those in FIG. 7A are represented by same numbers.

The driving line 215 for applying the pulse φd1 and the vertical lines 8' are composed of aluminum, while the driving line 101″ for applying the pulse φd2 and the gate electrodes 101 are composed of polysilicon.

Figure 16:
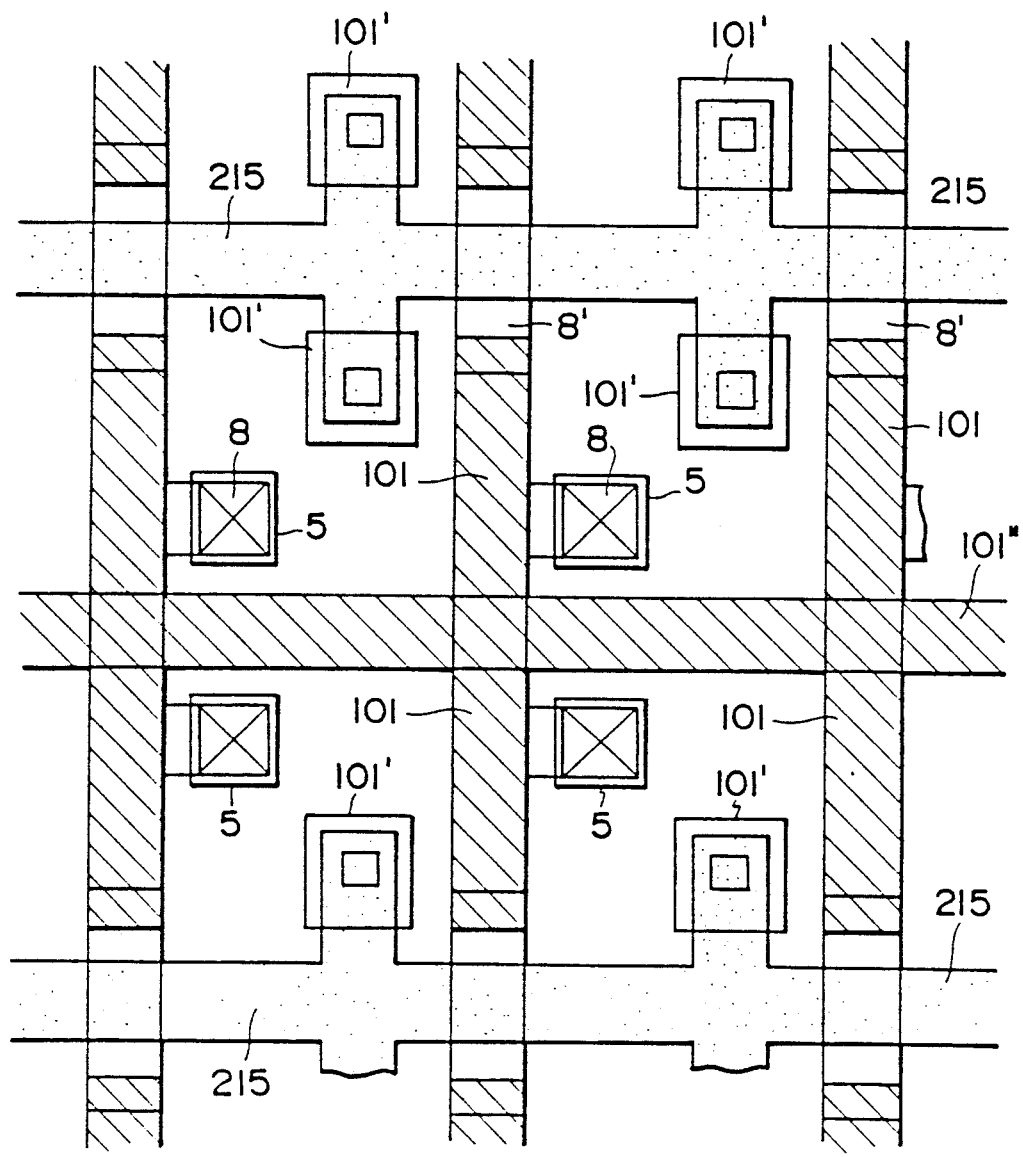

FIG. 16 is a schematic plan view of an eighth embodiment of the present invention.

In the present embodiment the driving lines 101″ and 215 are alternately provided on the separating areas, and the reading or refreshing operation is simultaneously conducted for two neighboring lines.

This structure allows to increase the aperture ratio, since the light-receiving area is not blocked by the driving line 215 as in the case of the seventh embodiment.

Figure 17:
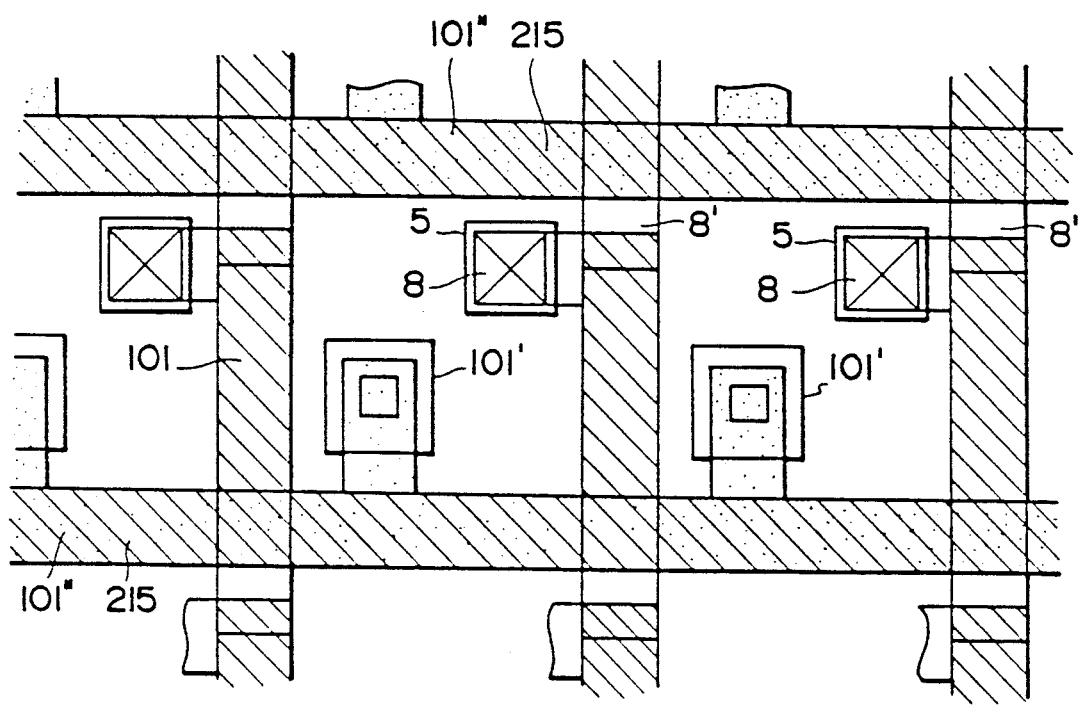

FIG. 17 is a schematic plan view of a ninth embodiment of the present invention.

In the present embodiment, the driving lines 101″ and 215 are formed in plural layers on a separating area, thus improving the aperture ratio in comparison with the seventh embodiment.

Though two lines are simultaneously read in the eighth embodiment, the ninth embodiment allows signal reading of each line or interlace scanning.

The photoelectric conversion apparatus of the seventh to ninth embodiments of the present invention is provided, as detailedly explained in the foregoing, with a first line for driving gate-insulated transistors and a second line for applying a control voltage to capacitors for controlling the potential of the semiconductor areas of the photoelectric conversion cells, so that the voltage range can be reduced in comparison with that in the conventional line for driving the photoelectric conversion cells.

It is therefore possible to resolve the problem of voltage resistance, and to reduce the burden of the driving system and the malfunctions. Also the circuit area, including the driving system, can be easily reduced since the insulating film need not be made thicker for withstanding a higher voltage.

What is claimed is:

1. A photoelectric conversion apparatus, comprising:
   first accumulation means for directly effecting a reading operation on a plurality of photoelectric conversion elements and accumulating read-out signals therefrom;
   second accumulation means for directly effecting a refreshing operation on the photoelectric conversion elements and accumulating signals remaining immediately after said refreshing operation;
   process means for processing the read-out signals and the remaining signals respectively accumulated in said first and second accumulation means to eliminate the remaining signal from said read-out signal; and
   control means for changing a magnitude of a predetermined bias supplied to the photoelectric conversion elements during the refreshing operation to supply a bias voltage different from that supplied during other operations.

2. A photoelectric conversion apparatus according to claim 1, wherein said first accumulation means and said second accumulation means, respectively, include a capacitor.

3. A photoelectric conversion apparatus according to claim 1, wherein said first accumulation means and said second accumulation means are connected to a corresponding photoelectric conversion element through a common signal read-out line.

4. A photoelectric conversion apparatus according to claim 3, wherein a switching transistor is connected between said first and second accumulation means and each photoelectric conversion element, said switching transistor being driven at a predetermined timing to turn on and off said signal read-out line.

5. A photoelectric conversion apparatus according to claim 1, wherein said process means includes a differential amplifier.

* * * * *

UNITED STATES PATENT AND TRADEMARK OFFICE
CERTIFICATE OF CORRECTION

PATENT NO. : 5,060,042
DATED : October 22, 1991
INVENTOR(S) : MAHITO SHINOHARA ET AL.          Page 1 of 4

It is certified that error appears in the above-identified patent and that said Letters Patent is hereby corrected as shown below:

COLUMN 1

Line 31, "is formed" (2nd occurrence) should be deleted.

COLUMN 3

Line 5, "causes" should read --cause--.

COLUMN 4

Line 10, "require" should read --requires--.
Line 48, "gate-insulated" should read --insulated gate--.
Line 62, "gate insulated" should read --insulated gate--.

COLUMN 5

Line 56, "a gate-insulated" should read
          --an insulated gate--.
Line 60, "gate-insulated" should read --insulated gate--.

COLUMN 6

Line 26, "function" should read --the function--.

COLUMN 7

Line 20, "formed," should read --formed--.
Line 33, "constructed" should read --constructed,--.
Line 54, "at pre-" should read --at a pre- --.

UNITED STATES PATENT AND TRADEMARK OFFICE
CERTIFICATE OF CORRECTION

PATENT NO. : 5,060,042
DATED : October 22, 1991
INVENTOR(S) : MAHITO SHINOHARA ET AL.  Page 2 of 4

It is certified that error appears in the above-identified patent and that said Letters Patent is hereby corrected as shown below:

COLUMN 8

Line 60, "miniatuarization" should read --miniaturization--.

COLUMN 9

Line 15, "trodes" should read --trodes 8--.
Line 58, "sowing" should read --showing--.

COLUMN 10

Line 22, "L1$\phi$Ln." should read --L1-Ln.--.
Line 27, "returns" should read --return--.
Line 63, "gate-insulated" should read --insulated gate--.

COLUMN 11

Line 6, "same" should read --the same--.
Line 7, "same" should read --the same--.
Line 52, "with" should read --without--.

COLUMN 12

Line 1, "respective" should read --respectively--.
Line 44, "$\phi$h2$\phi$hn" should read --$\phi$h2-$\phi$hn--.

COLUMN 13

Line 29, "same" should read --the same--.
Line 30, "same" should read --the same--.
Line 61, "same" should read --the same--.

UNITED STATES PATENT AND TRADEMARK OFFICE
CERTIFICATE OF CORRECTION

PATENT NO. : 5,060,042
DATED : October 22, 1991
INVENTOR(S) : MAHITO SHINOHARA ET AL.    Page 3 of 4

It is certified that error appears in the above-identified patent and that said Letters Patent is hereby corrected as shown below:

COLUMN 14

Line 13, "o" should be deleted.
Line 23, "same" should read --the same--.
Line 48, "same" should read --the same--.

COLUMN 15

Line 5, "same" should read --the same--.
Line 10, "same" should read --the same--.
Line 36, "simple" should read --sample--.
Line 49, "enable" should read --enables--.

COLUMN 16

Line 66, "same" should read --the same--.

COLUMN 17

Line 24, "gate-insulated" should read --insulated gate--.

UNITED STATES PATENT AND TRADEMARK OFFICE
CERTIFICATE OF CORRECTION

PATENT NO. : 5,060,042
DATED : October 22, 1991
INVENTOR(S) : MAHITO SHINOHARA ET AL.

It is certified that error appears in the above-identified patent and that said Letters Patent is hereby corrected as shown below:

<u>COLUMN 18</u>

Line 13, "remaining signal" should read
           --remaining signals--.

Signed and Sealed this

Thirteenth Day of July, 1993

Attest:

MICHAEL K. KIRK

*Attesting Officer*    *Acting Commissioner of Patents and Trademarks*